US009082978B2

(12) United States Patent
Tanaka et al.

(10) Patent No.: US 9,082,978 B2
(45) Date of Patent: Jul. 14, 2015

(54) PIEZOELECTRIC FILM AND METHOD OF MANUFACTURING THE PIEZOELECTRIC FILM, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

(71) Applicant: PANASONIC CORPORATION, Osaka (JP)

(72) Inventors: Yoshiaki Tanaka, Nara (JP); Takakiyo Harigai, Osaka (JP); Hideaki Adachi, Osaka (JP); Eiji Fujii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 34 days.

(21) Appl. No.: 14/029,638

(22) Filed: Sep. 17, 2013

(65) Prior Publication Data

US 2014/0036004 A1    Feb. 6, 2014

Related U.S. Application Data

(63) Continuation of application No. PCT/JP2013/002426, filed on Apr. 10, 2013.

(30) Foreign Application Priority Data

| Aug. 3, 2012 | (JP) | 2012-172636 |
| Aug. 3, 2012 | (JP) | 2012-172637 |
| Aug. 3, 2012 | (JP) | 2012-172638 |
| Aug. 3, 2012 | (JP) | 2012-172639 |

(51) Int. Cl.
*B41J 2/045*  (2006.01)
*H02N 2/00*  (2006.01)
(Continued)

(52) U.S. Cl.
CPC ......... *H01L 41/1878* (2013.01); *B41J 2/14201* (2013.01); *B41J 2/14233* (2013.01);
(Continued)

(58) Field of Classification Search
USPC ......... 310/311, 323.06, 357, 363; 347/70, 71, 347/72
See application file for complete search history.

(56) References Cited

U.S. PATENT DOCUMENTS 7,323,806 B2 *  1/2008  Shibata et al. ............... 310/358
7,870,787 B2   1/2011   Harigai et al.
(Continued)

FOREIGN PATENT DOCUMENTS

CN   101981718 A   2/2011
JP   62-202576 A   7/1987
(Continued)

OTHER PUBLICATIONS

Tadashi Takenaka et al., "(Bi1/2Na1/2)TiO3—BaTiO3 System for Lead-Free Piezoelectric Ceramics," Japanese Journal of Applied Physics, vol. 3, No. 9B, Sep. 1991, pp. 2236-2239.
(Continued)

*Primary Examiner* — Matthew Luu
*Assistant Examiner* — Patrick King
(74) *Attorney, Agent, or Firm* — McDermott Will & Emery LLP

(57) ABSTRACT

In order to provide a non-lead piezoelectric film having high crystalline orientation, low dielectric loss, high polarization-disappear temperature, and high piezoelectric constant, the present invention is a piezoelectric film comprising: a $Na_xM_{1-x}$ layer 13 having a (001) orientation only; and a $(1-\alpha)$ (Bi, Na, Ba) $TiO_3$-$\alpha BiQO_3$ layer 15 having a (001) orientation only. The $(1-\alpha)$ (Bi, Na, Ba) $TiO_3$-$\alpha BiQO_3$ layer 15 is formed on the $Na_xM_{1-x}$ layer 13. M represents Pt, Ir, or PtIr. Q represents Fe, Co, $Zn_{0.5}Ti_{0.5}$, or $Mg_{0.5}Ti_{0.5}$. x represents a value of not less than 0.002 and not more than 0.02. α represents a value of not less than 0.20 and not more than 0.50.

3 Claims, 22 Drawing Sheets

(51) Int. Cl.
H01L 41/187 (2006.01)
C30B 29/32 (2006.01)
G01C 19/5628 (2012.01)
B41J 2/14 (2006.01)
B41J 2/16 (2006.01)
G01C 19/5621 (2012.01)
H01L 41/047 (2006.01)
H01L 41/08 (2006.01)
H01L 41/09 (2006.01)
H01L 41/113 (2006.01)
H01L 41/316 (2013.01)
G01C 19/56 (2012.01)
H02N 2/18 (2006.01)
C30B 23/02 (2006.01)

(52) U.S. Cl.
CPC ............. *B41J 2/161* (2013.01); *B41J 2/1642* (2013.01); *B41J 2/1646* (2013.01); *C30B 23/02* (2013.01); *C30B 29/32* (2013.01); *G01C 19/56* (2013.01); *G01C 19/5621* (2013.01); *G01C 19/5628* (2013.01); *H01L 41/0477* (2013.01); *H01L 41/0805* (2013.01); *H01L 41/0973* (2013.01); *H01L 41/1136* (2013.01); *H01L 41/187* (2013.01); *H01L 41/316* (2013.01); *H02N 2/18* (2013.01); *B41J 2202/03* (2013.01)

(56) References Cited

U.S. PATENT DOCUMENTS

| 2007/0029592 A1* | 2/2007 | Ramesh | 257/295 |
| 2007/0029593 A1* | 2/2007 | Ramesh | 257/295 |
| 2007/0138459 A1* | 6/2007 | Wong et al. | 257/9 |
| 2007/0209572 A1* | 9/2007 | Hansen et al. | 117/11 |
| 2010/0194245 A1* | 8/2010 | Harigai et al. | 310/363 |
| 2011/0143146 A1* | 6/2011 | Harigai et al. | 428/446 |
| 2011/0175012 A1* | 7/2011 | Harigai et al. | 252/62.9 PZ |
| 2012/0038715 A1* | 2/2012 | Harigai et al. | 347/71 |

FOREIGN PATENT DOCUMENTS

| JP | 62-202576 A | 9/1987 |
| JP | 2000-128632 A | 5/2000 |
| JP | 4894983 B2 | 3/2012 |
| WO | 2010/047049 A1 | 4/2010 |

OTHER PUBLICATIONS

E. Venkata Ramana et al., "Synthesis and magnetoelectric studies on Na0.5Bi0.5TiO3—BiFeO3 solid," Solid State Sciences 12 (2010) 956-962.

Ye-Jing Dai et al., "Piezoelectric and Ferroelectric Properties of Li-Doped (Bi0.5Na0.5)TiO3—BaTiO3 Lead-Free Piezoelectric Ceramics," J. Am. Ceram. Soc., 93[4], 1108-1113 (2010).

International Search Report issued in PCT/JP2013/002426 with Date of mailing Jul. 9, 2013.

Tadashi Takenaka et al., "(Bi1/2Na1/2)TiO3—BaTiO3 System for Lead-Free Piezoelectric Ceramics," Japanese Journal of Applied Physics, vol. 30, No. 9B, Sep. 1991, pp. 2236-2239.

E. Venkata Ramana et al., "Synthesis and magnetoelectric studies on Na0.5Bi0.5TiO3—BiFeO3 solid solution ceramics", Solid State Sciences 12 (2010) 956-962.

* cited by examiner

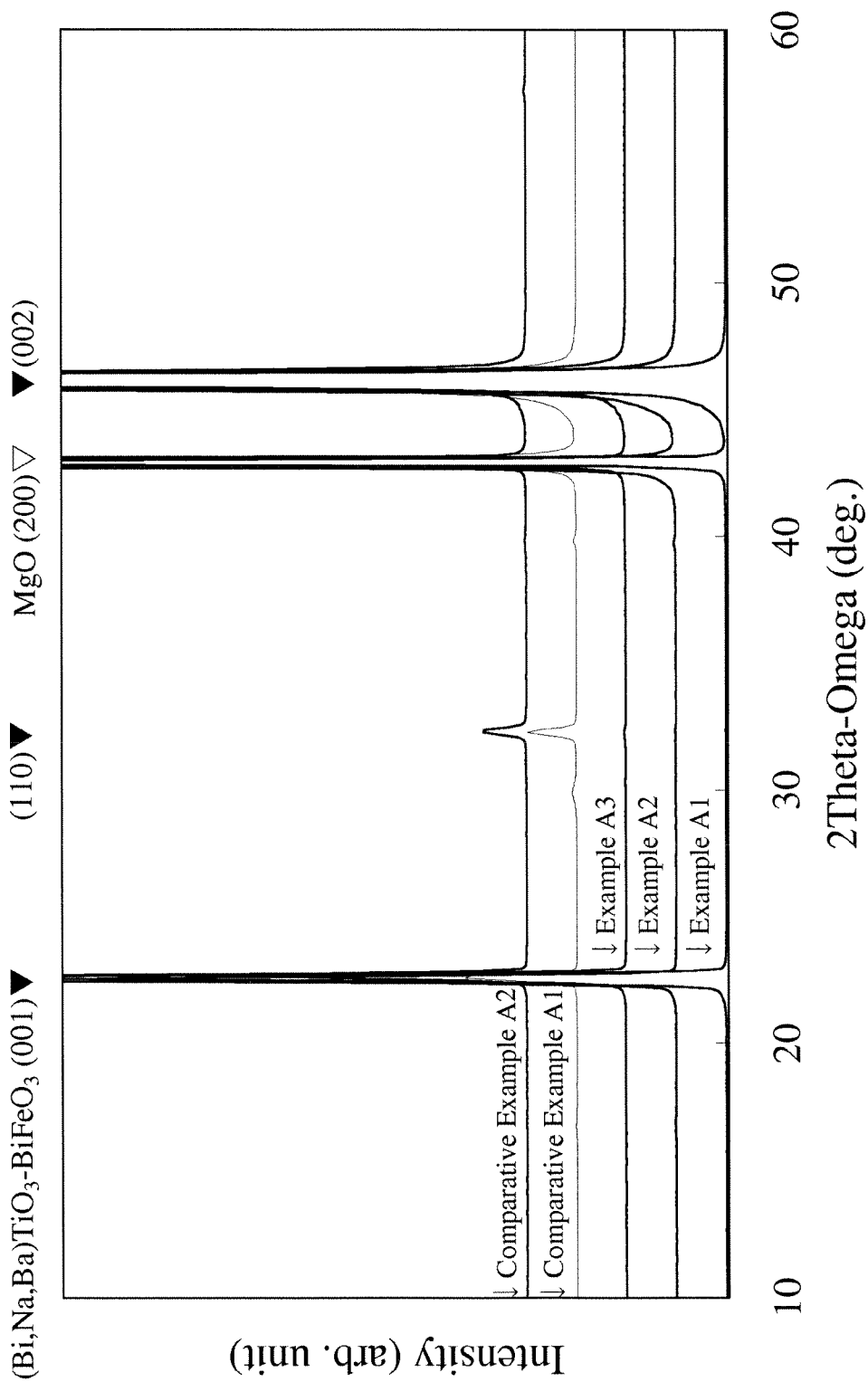

PIEZOELECTRIC FILM AND METHOD OF MANUFACTURING THE PIEZOELECTRIC FILM, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

This is a continuation of International Application No. PCT/JP2013/002426, with an international filing date of Apr. 10, 2013, which claims priority of Japanese Patent Application No. 2012-172636, filed on August 3, Japanese Patent Application No. 2012-172637, filed on August 3, Japanese Patent Application No. 2012-172638, filed on August 3, and Japanese Patent Application No. 2012-172639, filed on August 3, the contents of which are hereby incorporated by reference.

BACKGROUND OF THE INVENTION

1. Field of the Invention

The present invention relates to a piezoelectric film comprising a piezoelectric layer and a method of manufacturing the piezoelectric film. The present invention further relates to an ink jet head comprising the piezoelectric film and a method of forming an image by the head, to an angular velocity sensor comprising the piezoelectric film and a method of measuring an angular velocity by the sensor, and to a piezoelectric generating element comprising the piezoelectric film and a method of generating electric power using the element.

2. Description of the Related Art

Perovskite composite oxide [(Bi, Na)$_{1-\beta}$Ba$_\beta$]TiO$_3$ (hereinafter, referred to as "NBT-BT") has been recently researched and developed as a non-lead (lead-free) ferroelectric material.

Japanese Patent Publication No. Hei 4-60073B and T. Takenaka et al., Japanese Journal of Applied Physics, Vol. 30, No. 9B, (1991), pp. 2236-2239 disclose that a NBT-BT layer has high piezoelectric performance when the NBT-BT layer has a composition around the Morphotropic Phase Boundary (hereinafter, referred to as "MPB") having a barium molar ratio $\beta$ (=[Ba/(Bi+Na+Ba)]) of 3-15%.

Japanese Patent Publication No. 4140796B and E. V. Ramana et al., Solid State Sciences, Vol. 12, (2010), pp. 956-962 disclose (1-$\alpha$)(Bi,Na,Ba)TiO$_3$-$\alpha$BiFeO$_3$ where perovskite composite oxide NBT-BT is combined with perovskite oxide BiFeO$_3$. The piezoelectric performance of the (1-$\alpha$)(Bi,Na,Ba)TiO$_3$-$\alpha$BiFeO$_3$ is maintained even at a solder reflow temperature of 180 degrees Celsius.

The (1-$\alpha$) (Bi, Na, Ba) TiO$_3$-$\alpha$BiFeO$_3$ has also been expected as a non-lead ferroelectric material capable of being used instead of PZT. However, the (1-$\alpha$) (Bi, Na, Ba) TiO$_3$-$\alpha$BiFeO$_3$ has lower piezoelectric performance than the PZT.

A ferroelectric material containing (Bi, Na, Ba) TiO$_3$ or BiFeO$_3$ has high dielectric loss. When the dielectric loss is high, the ferroelectric performance and the piezoelectric performance are deteriorated significantly.

SUMMARY OF THE INVENTION

An object of the present invention is to provide a non-lead piezoelectric film having high crystalline orientation, low dielectric loss, high polarization-disappear temperature, and high piezoelectric constant.

It is another object of the present invention to provide an ink jet head, an angular velocity sensor, and a piezoelectric generating element, each comprising the non-lead piezoelectric film. It is still another object of the present invention to provide a method of forming an image by this ink jet head, a method of measuring an angular velocity by this angular velocity sensor, and a method of generating electric power using this piezoelectric generating element.

The present invention provides a piezoelectric film comprising:

a Na$_x$M$_{1-x}$ layer having a (001) orientation only; and
a (1-$\alpha$) (Bi, Na, Ba) TiO$_3$-$\alpha$BiQO$_3$ layer having a (001) orientation only; wherein
the (1-$\alpha$) (Bi, Na, Ba) TiO$_3$-$\alpha$BiQO$_3$ layer is formed on the Na$_x$M$_{1-x}$ layer;
M represents Pt, Ir, or PtIr;
Q represents Fe, Co, Zn$_{0.5}$Ti$_{0.5}$, or Mg$_{0.5}$Ti$_{0.5}$;
x represents a value of not less than 0.002 and not more than 0.02; and
$\alpha$ represents a value of not less than 0.20 and not more than 0.50.

The spirit of the present invention includes an ink jet head, an angular velocity sensor, and a piezoelectric generating element, each of which comprises the piezoelectric film.

The spirit of the present invention includes a method of measuring an angular velocity by the angular velocity sensor, a method of forming an image by the ink jet head, and a method of generating electric power using the piezoelectric generating element.

The present invention provides a non-lead piezoelectric film having high crystalline orientation, low dielectric loss, high polarization-disappear temperature, and high piezoelectric constant.

The present invention provides an ink jet head comprising the non-lead piezoelectric film and a method of forming an image by the head.

The present invention provides an angular velocity sensor comprising the non-lead piezoelectric film and a method of measuring an angular velocity by the sensor.

The present invention provides a piezoelectric generating element comprising the non-lead piezoelectric film and a method of generating electric power using the element.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIG. 2 shows an X-ray diffraction profile of the piezoelectric films according to the example A1—the example A3 and the comparative example A1—the example A2.

DETAILED DESCRIPTION OF THE INVENTION

Figure 1A:
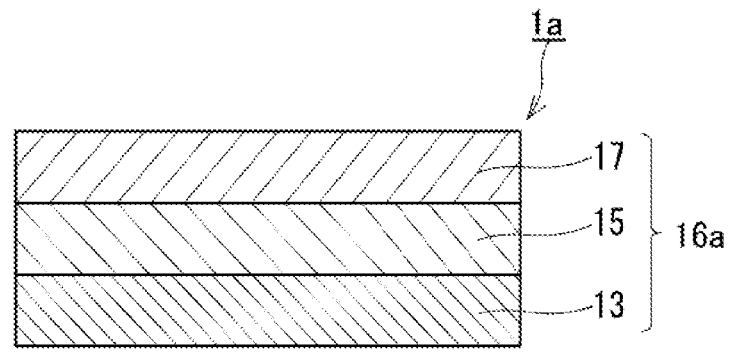
FIG. 1A shows a cross-sectional view of a piezoelectric film according to an embodiment.

Embodiments of the present invention are described below with reference to the drawings. In the following description, the same reference numerals are used to designate the same elements and parts, and therefore the overlapping description thereof can be omitted.

DEFINITION OF TERM

The term used in the instant specification is defined as below.

The term "temperature Td" means the temperature at which a polarization included in the piezoelectric layer disappears completely by heating the piezoelectric layer. In other words, the piezoelectric layer completely loses its polarization at a temperature more than the temperature Td. The piezoelectric layer which does not have the polarization fails to serve as a piezoelectric layer. In view of the solder reflow, it is desirable that the temperature Td be not less than 180 degrees Celsius.

[Piezoelectric Film]

FIG. 1A shows a piezoelectric film according to an embodiment. A piezoelectric film $1a$ shown in FIG. 1A has a multilayer structure $16a$. This multilayer structure $16a$ comprises a $Na_xM_{1-x}$ layer 13 having a (001) orientation only and a $(1-\alpha)$ (Bi, Na, Ba) $TiO_3$-$\alpha BiQO_3$ layer 15 having a (001) orientation only. The character "M" represents Pt, Ir, or PtIr. The character "Q" represents Fe, Co, $Zn_{0.5}Ti_{0.5}$, or $Mg_{0.5}Ti_{0.5}$. The $Na_xM_{1-x}$ layer 13 serves as a first electrode layer. The multilayer structure $16a$ further comprises a second electrode layer 17. The $(1-\alpha)$ (Bi, Na, Ba) $TiO_3$-$\alpha BiQO_3$ layer 15 is interposed between the first electrode layer 13 and the second electrode layer 17. The first electrode layer 13 and the second electrode layer 17 are used to apply a voltage to the $(1-\alpha)$ (Bi, Na, Ba) $TiO_3$-$\alpha BiQO_3$ layer 15.

The $(1-\alpha)$ (Bi, Na, Ba) $TiO_3$-$\alpha BiQO_3$ layer 15 has a (001) orientation only. In other words, the $(1-\alpha)$ (Bi, Na, Ba) $TiO_3$-$\alpha BiQO_3$ layer 15 does not have an orientation other than a (001) orientation. For example, the $(1-\alpha)$ (Bi, Na, Ba) $TiO_3$-$\alpha BiQO_3$ layer 15 does not have a (110) orientation. See the comparative examples A1, A2, B1, B2, C1, C2, D1 and D2, which are described later.

Similarly, the $Na_xM_{1-x}$ layer 13 has a (001) orientation only.

The character x represents a value of not less 0.002 and not more than 0.02. When the value of x is less than 0.002, the crystalline orientation, the polarization-disappear temperature, and the piezoelectric constant are low. Furthermore, the dielectric loss is high. See the comparative examples A1, B1, C1, D1, and D2, which are described later.

When the value of x is over 0.02, the crystalline orientation, the polarization-disappear temperature, and the piezoelectric constant are low. Furthermore, the dielectric loss is high. See the comparative examples A2, B2, C2, and D2, which are described later.

The value of α is not less than 0.20 and not more than 0.50. When the value of α is less than 0.20, the polarization-disappear temperature is low. See the comparative examples A3, B3, C3, and D3, which are described later.

When the value of α is over 0.50, the crystalline orientation, the polarization-disappear temperature, and the piezoelectric constant are low. Furthermore, the dielectric loss is high. See the comparative examples A4, B4, C4, and D4, which are described later.

It is desirable that these stacked layers be in contact with each other. The $(1-\alpha)$ (Bi, Na, Ba) $TiO_3$-$\alpha BiQO_3$ layer 15 serves as a piezoelectric layer. The $(1-\alpha)$ (Bi, Na, Ba) $TiO_3$-$\alpha BiQO_3$ layer 15 has a small leak current, high crystallinity, and a high (001) orientation. For this reason, the $(1-\alpha)$ (Bi, Na, Ba) $TiO_3$-$\alpha BiQO_3$ layer 15 has high polarization-disappear temperature, low dielectric loss, and high piezoelectric performance, although it does not contain lead. The $(1-\alpha)$ (Bi, Na, Ba) TiO$_3$-$\alpha$BiQO$_3$ layer 15 has piezoelectric performance similar to that of the PZT layer.

Typically, the Na$_x$M$_{1-x}$ layer 13 can be formed by sputtering. The Na$_x$M$_{1-x}$ layer 13 can also be formed by a thin film formation technique such as pulsed laser deposition (PLD), chemical vapor deposition (CVD), sol-gel processing, or aerosol deposition (AD).

The thickness of the Na$_x$M$_{1-x}$ layer 13 is not limited. As one example, the Na$_x$M$_{1-x}$ layer 13 has a thickness of not less than approximately 2 nanometers.

The thickness of the $(1-\alpha)$ (Bi, Na, Ba) TiO$_3$-$\alpha$BiQO$_3$ layer 15 is also not limited. The thickness thereof is at least 0.5 micrometers but not more than 10 micrometers, for example.

The $(1-\alpha)$ (Bi, Na, Ba) TiO$_3$-$\alpha$BiQO$_3$ layer 15 has a perovskite crystal structure represented by the chemical formula ABO$_3$. The A site is Bi, Na, and Ba. The B site is Ti and Q. The $(1-\alpha)$ (Bi, Na, Ba) TiO$_3$-$\alpha$BiQO$_3$ layer 15 may contain a minute amount of impurities. The impurities typically may be Li and K to substitute for Na, and Sr and Ca to substitute for Ba, in the A site. The impurities typically may be Zr to substitute for Ti in the B site. Examples of the other impurities may include Mn, Co, Al, Ga, Nb, and Ta. Some of these impurities can improve the crystallinity and piezoelectric performance of the $(1-\alpha)$ (Bi, Na, Ba) TiO$_3$-$\alpha$BiQO$_3$ layer 15.

Typically, the $(1-\alpha)$ (Bi, Na, Ba) TiO$_3$-$\alpha$BiQO$_3$ layer 15 can be formed by sputtering. The $(1-\alpha)$ (Bi, Na, Ba) TiO$_3$-$\alpha$BiQO$_3$ layer 15 can also be formed by another thin film formation technique such as PLD, CVD, sol-gel processing, or AD.

An example of the material of the second electrode layer 17 is a metal having a low electric resistance. Other examples of the material of the second electrode layer 17 include oxide conductors such as NiO, RuO$_2$, IrO$_3$, SrRuO$_3$, and LaNiO$_3$. The second electrode layer 17 may be composed of two or more kinds of these materials.

A metal layer may be interposed between the second electrode layer 17 and the (Bi, Na)TiO$_3$—BaTiO$_3$ layer 15 to improve the adhesion therebetween. Examples of the material of the metal layer include titanium, tantalum, iron, cobalt, nickel, and chrome. Two or more kinds of metals may be used.

Figure 1B:
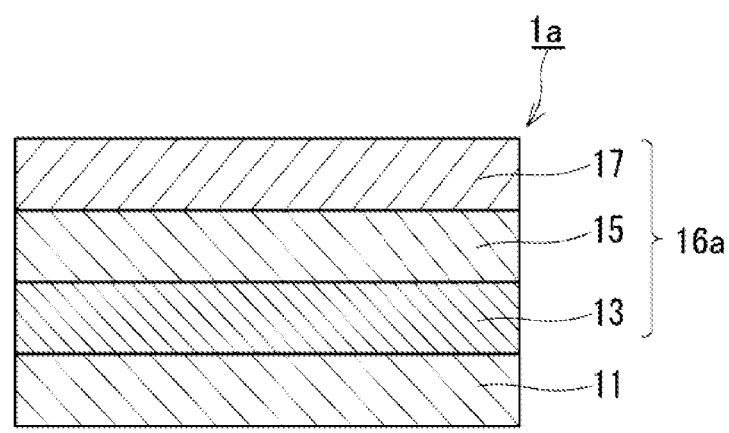
FIG. 1B shows a variation of the piezoelectric film shown in FIG. 1A.

FIG. 1B shows a variation of the piezoelectric film shown in FIG. 1A. As shown in FIG. 1B, a multilayer structure 16b further comprises a substrate 11. The Na$_x$M$_{1-x}$ layer 13 is formed on the substrate 11.

Examples of the substrate 11 are described below:
 a silicon substrate;
 an oxide substrate having a sodium chloride structure such as a MgO substrate,
 an oxide substrate having a perovskite-type structure such as a SrTiO$_3$ substrate, a LaAlO$_3$ substrate, or a NdGaO$_3$ substrate;
 an oxide substrate having a corundum-type structure such as a Al$_2$O$_3$ substrate;
 an oxide substrate having a spinel-type structure such as a MgAl$_2$O$_4$ substrate;
 an oxide substrate having a rutile-type structure such as a TiO$_2$ substrate; and
 an oxide substrate having a crystal structure of cubic system such as a (La, Sr) (Al, Ta) O$_3$ substrate or an yttria-stabilized zirconia (YSZ) substrate.

Desirably, a silicon monocrystalline substrate or a MgO monocrystalline substrate may be used.

An interlayer may be formed on the surface of the substrate 11 by an epitaxial growth method. An example of the material of the interlayer is yttria-stabilized zirconia (YSZ).

Other examples of the material of the interlayer are described below:
 materials having a fluorite-type structure such as CeO$_2$,
 materials having a sodium chloride structure such as MgO, BaO, SrO, TiN, and ZrN,
 materials having a perovskite-type structure such as SrTiO$_3$, LaAlO$_3$, (La, Sr) MnO$_3$, and (La, Sr) CoO$_3$; and
 materials having a spinel-type structure such as $\gamma$-Al$_2$O$_3$ and MgAl$_2$O$_4$.

Two or more kinds of these materials may be used. As one example, the substrate 11 may be a laminate of CeO$_2$/YSZ/Si.

A metal layer is interposed between the substrate 11 and the Na$_x$M$_{1-x}$ layer 13 to improve the adhesion therebetween. Examples of the material of the metal layer include Ti, Ta, Fe, Co, Ni, and Cr. Ti is desirable.

Examples

The following examples describe the present invention in more detail.

The following examples are composed of the example A, the example B, the example C, and the example D.

In the example A, Q of the $(1-\alpha)$ (Bi, Na, Ba) TiO$_3$-$\alpha$BiQO$_3$ layer 15 is Fe. The example A is composed of the example A1—the example A10 and the comparative example A1—the comparative example A4.

In the example B, Q of the $(1-\alpha)$ (Bi, Na, Ba) TiO$_3$-$\alpha$BiQO$_3$ layer 15 is Co. The example B is composed of the example B1—the example B10 and the comparative example B1—the comparative example B4.

In the example C, Q of the $(1-\alpha)$ (Bi, Na, Ba) TiO$_3$-$\alpha$BiQO$_3$ layer 15 is Zn$_{0.5}$Ti$_{0.5}$. The example C is composed of the example C1—the example C10 and the comparative example C1—the comparative example C4.

In the example D, Q of the $(1-\alpha)$ (Bi, Na, Ba) TiO$_3$-$\alpha$BiQO$_3$ layer 15 is Mg$_{0.5}$Ti$_{0.5}$. The example D is composed of the example D1—the example D10 and the comparative example D1—the comparative example D4.

EXAMPLES

Example A1

A piezoelectric film shown in FIG. 1B was prepared as below.

First, a Na$_x$M$_{1-x}$ (x=0.01, M=Pt) layer 13 having a (001) orientation only was formed on a MgO (100) monocrystalline substrate 11 by a sputtering method. The Na$_x$M$_{1-x}$ (x=0.01, M=Pt) layer 13 had a thickness of 250 nanometers. The condition of the sputtering method is described below:
 Target: Same composition as above
 Gas atmosphere: Argon
 RF power: 15 W
 Substrate temperature: 300 degrees Celsius The formed Na$_x$M$_{1-x}$ (x=0.01, M=Pt) layer 13 was subjected to an X-ray diffraction analysis (XRD). As a result, it was observed that the Na$_x$M$_{1-x}$ (x=0.01, M=Pt) layer 13 had a (001) orientation only.

The composition of the Na$_x$M$_{1-x}$ (x=0.01, M=Pt) layer 13 was analyzed by an energy dispersive X-ray spectroscopy (SEM-EDX). It was confirmed that the composition of Na and Pt contained in the Na$_x$M$_{1-x}$ (x=0.01, M=Pt) layer 13 was the same as the composition of the target.

The $(1-\alpha)$ (Bi, Na, Ba) TiO$_3$-$\alpha$BiQO$_3$ layer 15 having a (001) orientation only was formed on the Na$_x$M$_{1-x}$ (x=0.01, M=Pt) layer 13 by RF magnetron sputtering. In the example A1, Q was Fe. In the example A1, $\alpha$ was 0.2. The $(1-\alpha)$ (Bi, Na, Ba) TiO$_3$-αBiQO$_3$ layer 15 had a thickness of 2.7 micrometers. This (1-α) (Bi, Na, Ba) TiO$_3$-αBiQO$_3$ layer 15 had a composition around MPB.

The condition of the sputtering method of the (1-α) (Bi, Na, Ba) TiO$_3$-αBiQO$_3$ layer 15 is described below.

Target: Same composition as above
Atmosphere: Mixed gas of argon and oxygen (Flow ratio of Ar/O$_2$:50/50)
RF power: 170 W
Substrate temperature: 650 degrees Celsius The formed (1-α) (Bi, Na, Ba) TiO$_3$-αBiQO$_3$ layer 15 was subjected to an X-ray diffraction analysis to analyze the crystal structure thereof. The X-ray diffraction analysis was carried out in such a manner that an X-ray beam was made incident from above the (1-α) (Bi, Na, Ba) TiO$_3$-αBiQO$_3$ layer 15. FIG. 2 shows the result thereof. In the following examples and the comparative examples below, X-ray diffraction analyses were carried out in the same manner.

Figure 3:
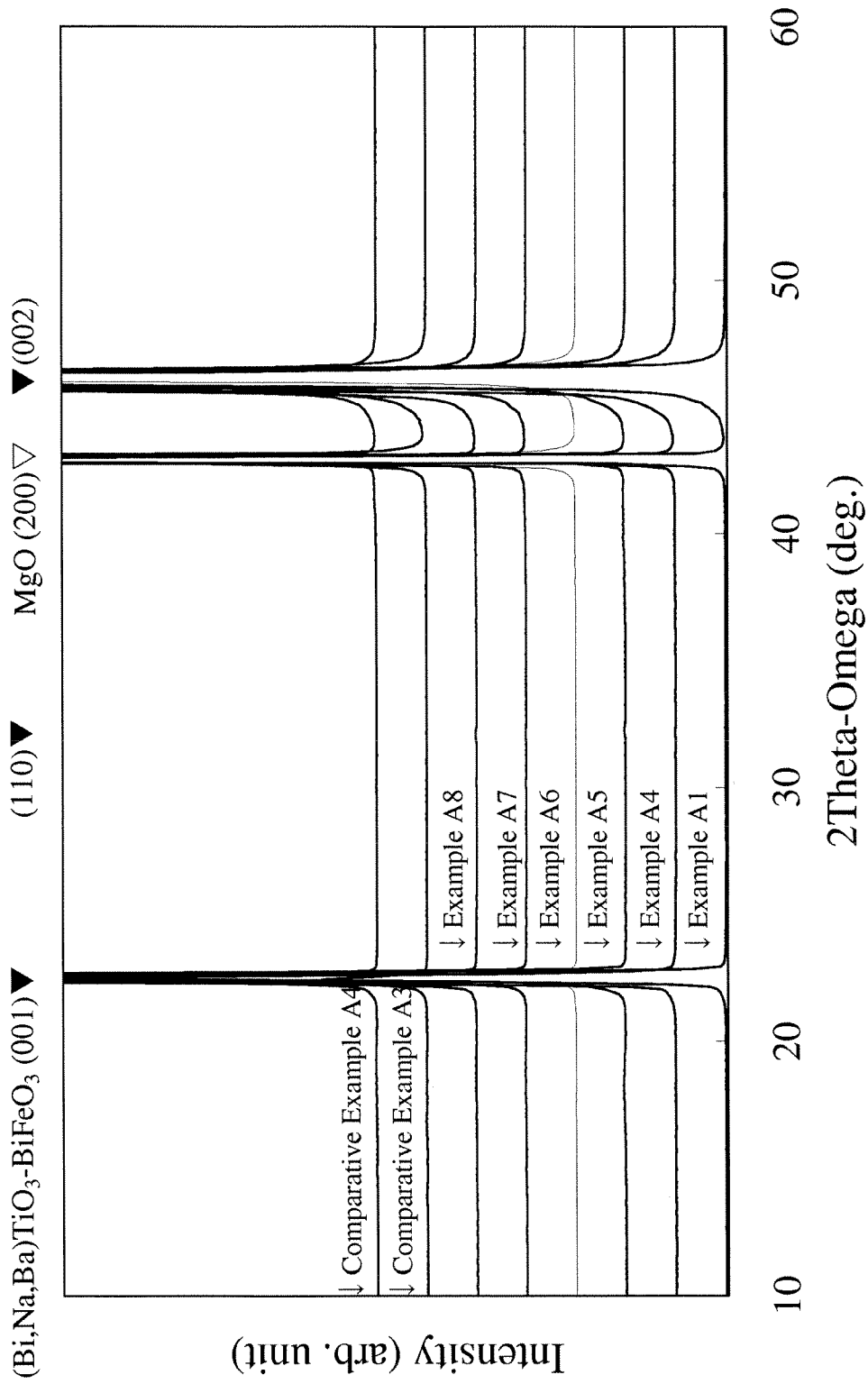
FIG. 3 shows an X-ray diffraction profile of the piezoelectric films according to the example A1, the example A4—the example A8, and the comparative example A3—the comparative example A4.
Figure 4:
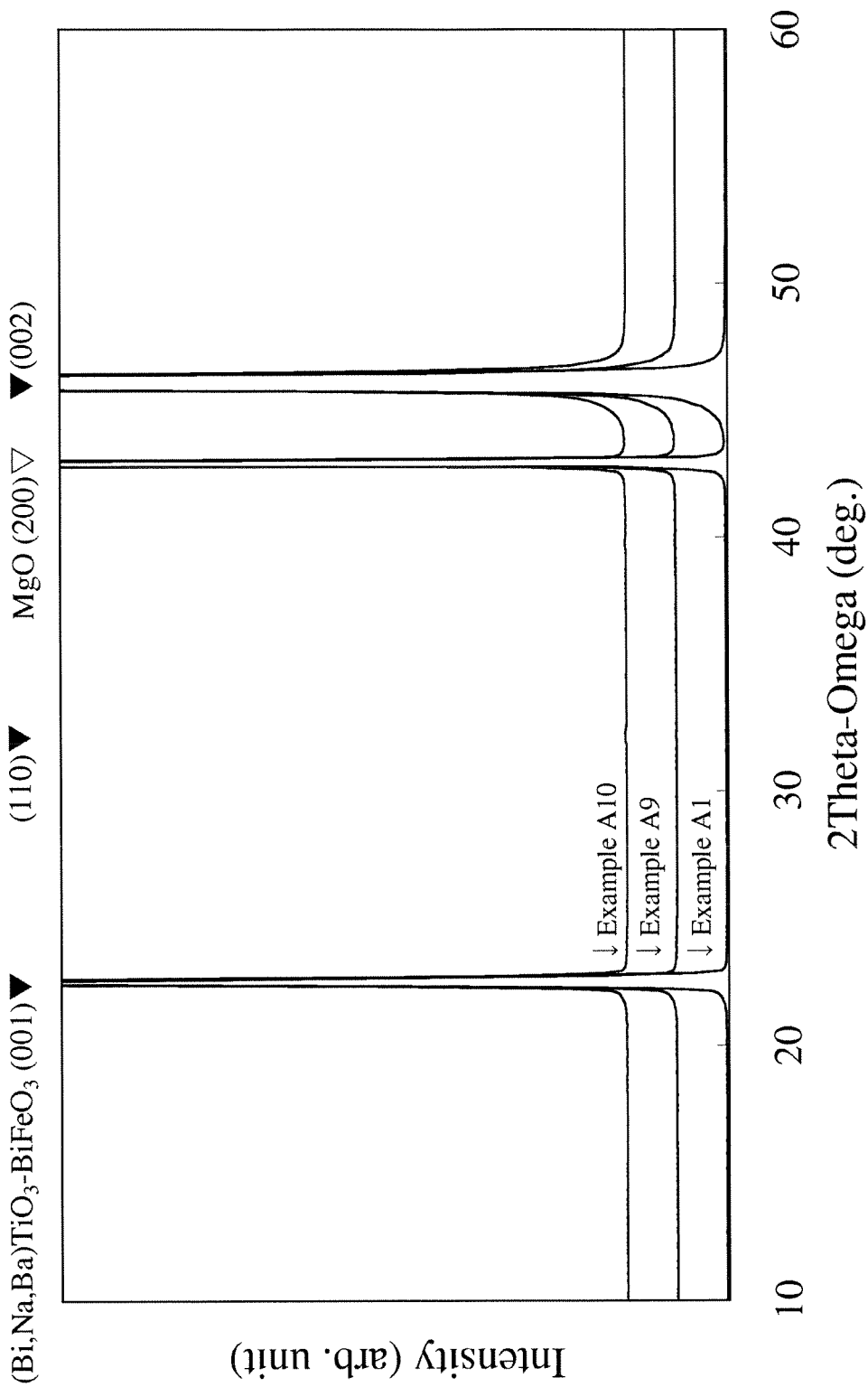
FIG. 4 shows an X-ray diffraction profile of the piezoelectric films according to the example A1, the example A9, and the example A10.

FIG. 2, FIG. 3, and FIG. 4 show the results of the X-ray diffraction profile. Observed was only the reflection peak derived from the (1-α) (Bi, Na, Ba) TiO$_3$-αBiQO$_3$ layer 15 having a (001) orientation only, except for the reflection peaks derived from the MgO (100) monocrystalline substrate 11 and the Na$_x$M$_{1-x}$ layer 13. The intensity of the (001) reflection peak was 119,154 cps, which was a very high level. The profile shown in FIG. 2 means that the (1-α) (Bi, Na, Ba) TiO$_3$-αBiQO$_3$ layer 15 according to the example A1 has a significantly high (001) orientation.

Then, a gold layer (thickness: 100 nanometers) was formed by evaporation on the surface of the (1-α) (Bi, Na, Ba)TiO$_3$-αBiQO$_3$ layer 15. This gold layer served as the conductive layer 17. In this way, the piezoelectric film according to the example A1 was fabricated.

Figure 5:
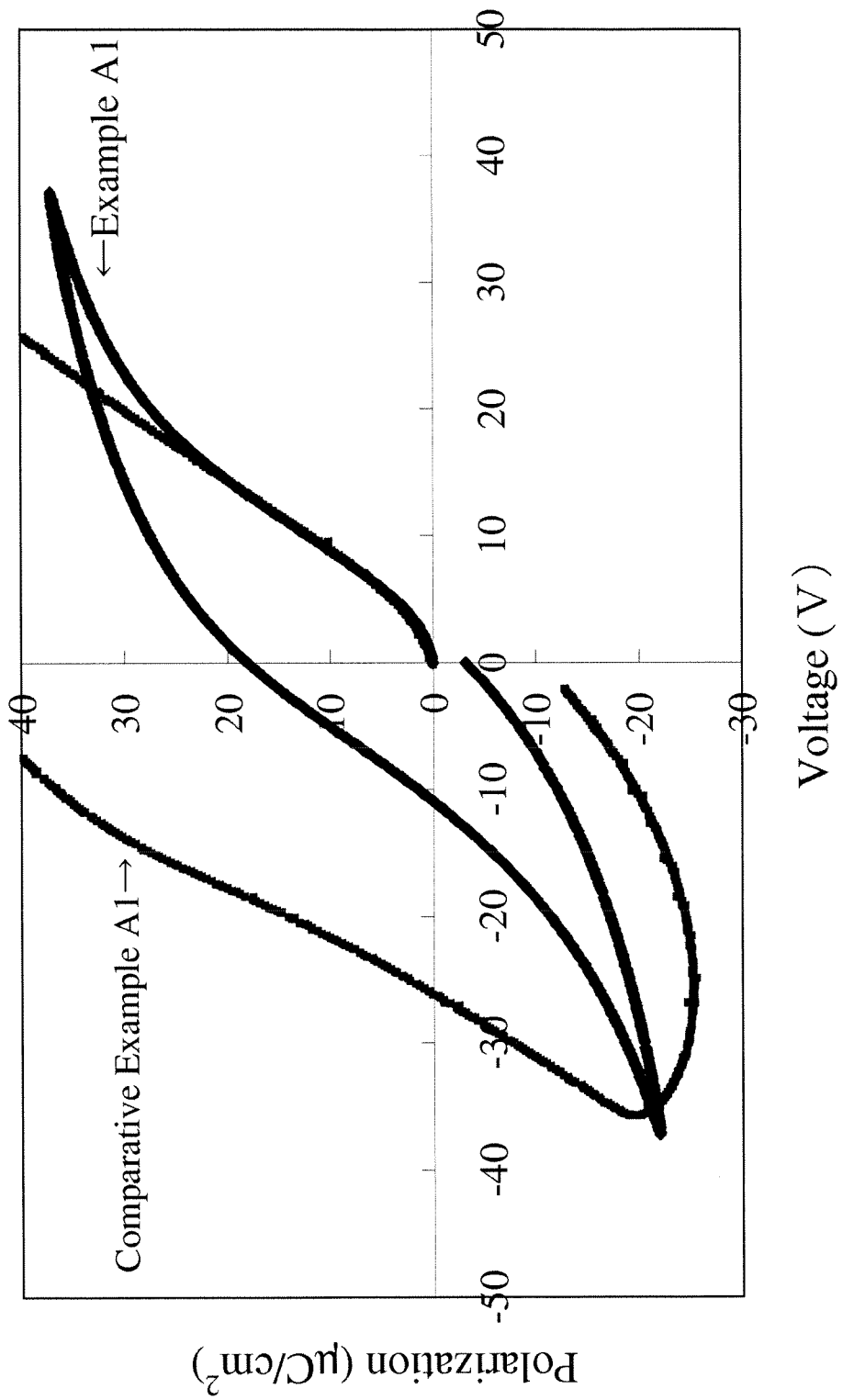
FIG. 5 shows P-E hysteresis curves of the piezoelectric films according to the example A1 and the comparative example A1.

Using a platinum layer and the gold layer, the ferroelectric performance and the piezoelectric performance of the (1-α) (Bi, Na, Ba) TiO$_3$-αBiQO$_3$ layer 15 were evaluated. FIG. 5 shows a P-E hysteresis curve of the (1-α) (Bi, Na, Ba) TiO$_3$-αBiQO$_3$ layer 15 according to the example A1.

As shown in FIG. 5, it was confirmed that the (1-α) (Bi, Na, Ba) TiO$_3$-αBiQO$_3$ layer 15 exhibited better ferroelectric performance with an increase in the voltage applied to the (1-α) (Bi, Na, Ba) TiO$_3$-αBiQO$_3$ layer 15. An impedance analyzer was used to measure the dielectric loss (hereinafter, referred to as "tan δ") at 1 kHz. As a result, the value of tan δ of the (1-α) (Bi, Na, Ba) TiO$_3$-αBiQO$_3$ layer 15 was 2.8%. This means that the leak current of the (1-α) (Bi, Na, Ba) TiO$_3$-αBiQO$_3$ layer 15 is small.

The polarization-disappear temperature, namely, the temperature Td, of the (1-α) (Bi, Na, Ba) TiO$_3$-αBiQO$_3$ layer 15 was measured as below.

The (1-α) (Bi, Na, Ba) TiO$_3$-αBiQO$_3$ layer 15 was set in a thermostatic oven. The P-E hysteresis curve of the (1-α) (Bi, Na, Ba) TiO$_3$-αBiQO$_3$ layer 15 was measured with an increase in temperature.

The temperature Td was measured in accordance with Journal of the American Ceramic Society 93 [4] (2010) 1108-1113.

The temperature Td of the (1-α) (Bi, Na, Ba) TiO$_3$-αBiQO$_3$ layer 15 according to the example A1 was a high value of 188 degrees Celsius. This means that the piezoelectric performance of the (1-α) (Bi, Na, Ba) TiO$_3$-αBiQO$_3$ layer 15 is maintained under a solder reflow temperature (180 degrees Celsius).

The piezoelectric performance of the (1-α) (Bi, Na, Ba) TiO$_3$-αBiQO$_3$ layer 15 was evaluated in the following manner. The (1-α) (Bi, Na, Ba) TiO$_3$-αBiQO$_3$ layer 15 was cut into a strip with a width of 2 mm and worked into a cantilever shape. A potential difference was applied between the platinum layer and the gold layer, and the cantilever was displaced by the electric field generated between the two layers. The resulting displacement of the cantilever was measured with a laser displacement meter.

These results are shown in Table 1 and Table 2.

Example A2

An example similar to the example A1 was conducted, except that x=0.002. The results are shown in Table 1 and Table 2.

Example A3

An example similar to the example A1 was conducted, except that x=0.02. The results are shown in Table 1 and Table 2.

Example A4

An example similar to the example A1 was conducted, except that α=0.3. The results are shown in Table 1 and Table 2.

Example A5

An example similar to the example A1 was conducted, except that α=0.4. The results are shown in Table 1 and Table 2.

Example A6

An example similar to the example A1 was conducted, except that α=0.5. The results are shown in Table 1 and Table 2.

Example A7

An example similar to the example A1 was conducted, except that x=0.002 and α=0.5. The results are shown in Table 1 and Table 2.

Example A8

An example similar to the example A1 was conducted, except that x=0.02 and α=0.5. The results are shown in Table 1 and Table 2.

Example A9

An example similar to the example A1 was conducted, except that M=Ir. The results are shown in Table 1 and Table 2.

Example A10

An example similar to the example A1 was conducted, except that M=Ir$_{0.5}$Pt$_{0.5}$. The results are shown in Table 1 and Table 2.

Comparative Example A1

An example similar to the example A1 was conducted, except that x=0.

Similarly, the present inventors tried the evaluation of the ferroelectric performance and the piezoelectric performance of the (1-α) (Bi, Na, Ba) TiO$_3$-αBiQO$_3$ layer 15 in the comparative example A1. However, it was difficult to measure the P-E hysteresis curve accurately, since the leak current in the piezoelectric film was very high (see FIG. 5).

The $(1-\alpha)$ (Bi, Na, Ba) $TiO_3$-$\alpha BiQO_3$ layer 15 according to the comparative example A1 had a tan δ of 36%. It was difficult to measure the accurate temperature Td and the accurate piezoelectric constant $d_{31}$, since the $(1-\alpha)$ (Bi, Na, Ba) $TiO_3$-$\alpha BiQO_3$ layer 15 of the comparative example A1 had such a high leak current. The estimated temperature Td was approximately 152 degrees Celsius.

Comparative Example A2

An example similar to the example A1 was conducted, except that x=0.05.

The reflection peak derived from the $(1-\alpha)$ (Bi, Na, Ba) $TiO_3$-$\alpha BiQO_3$ layer 15 having a (001) orientation was also observed in the comparative example A2. However, another reflection peak derived from another crystalline orientation (110) included in the $(1-\alpha)$ (Bi, Na, Ba) $TiO_3$-$\alpha BiQO_3$ layer 15 was also observed.

Comparative Example A3

An example similar to the example A1 was conducted, except that α=0.1.

Comparative Example A4

An example similar to the example A1 was conducted, except that α=0.6.

TABLE 1

| | M | x | α | Orientation direction | (001) Peak intensity (cps) |
|---|---|---|---|---|---|
| | | | | Q = Fe | |
| Example A1 | Pt | 0.01 | 0.20 | only (001) | 119,154 |
| Example A2 | Pt | 0.002 | 0.20 | only (001) | 79,088 |
| Example A3 | Pt | 0.02 | 0.20 | only (001) | 85,365 |
| Example A4 | Pt | 0.01 | 0.30 | only (001) | 115,840 |
| Example A5 | Pt | 0.01 | 0.40 | only (001) | 109,883 |
| Example A6 | Pt | 0.01 | 0.50 | only (001) | 96,060 |
| Example A7 | Pt | 0.002 | 0.50 | only (001) | 65,618 |
| Example A8 | Pt | 0.02 | 0.50 | only (001) | 69,360 |
| Example A9 | Ir | 0.01 | 0.20 | only (001) | 95,354 |
| Example A10 | Pt$_{0.5}$Ir$_{0.5}$ | 0.01 | 0.20 | only (001) | 107,201 |
| Comparative example A1 | Pt | 0 | 0.20 | (001) and (110) | 26,452 |
| Comparative example A2 | Pt | 0.05 | 0.20 | (001) and (110) | 41,163 |
| Comparative example A3 | Pt | 0.01 | 0.10 | only (001) | 126,327 |
| Comparative example A4 | Pt | 0.01 | 0.60 | only (001) | 39,719 |

TABLE 2

| | Dielectric loss (tan δ) | Polarization-disappear temperature Td (degree Celsius) | Piezoelectric constant d31 |
|---|---|---|---|
| | Q = Fe | | |
| Example A1 | 2.8% | 188 | −106 pC/N |
| Example A2 | 4.0% | 185 | −87 pC/N |
| Example A3 | 4.3% | 186 | −90 pC/N |
| Example A4 | 3.2% | 209 | −103 pC/N |

TABLE 2-continued

| | Dielectric loss (tan δ) | Polarization-disappear temperature Td (degree Celsius) | Piezoelectric constant d31 |
|---|---|---|---|
| | Q = Fe | | |
| Example A5 | 3.6% | 228 | −98 pC/N |
| Example A6 | 4.0% | 251 | −96 pC/N |
| Example A7 | 5.2% | 226 | −84 pC/N |
| Example A8 | 5.6% | 223 | −87 pC/N |
| Example A9 | 2.8% | 188 | −106 pC/N |
| Example A10 | 2.8% | 188 | −102 pC/N |
| Comparative example A1 | 36% | 152 | −35 pC/N |
| Comparative example A2 | 18% | 160 | −61 pC/N |
| Comparative example A3 | 2.7% | 138 | −97 pC/N |
| Comparative example A4 | 22% | 171 | −58 pC/N |

As is clear from Table 1 and Table 2, if both of the following items (a) and (b) are satisfied, the $(1-\alpha)$ (Bi, Na, Ba) $TiO_3$-$\alpha BiQO_3$ layer 15 (Q=Fe) has high crystalline orientation, low dielectric loss, high polarization-disappear temperature, and high piezoelectric constant.

(a) the value of x is not less than 0.002 and not more than 0.02.

(b) the value of α is not less than 0.2 and not more than 0.5.

As is clear from the example A2, the example A7, and the comparative example A1, it is necessary that the value of x is not less than 0.002.

As is clear from the example A3, the example A8, and the comparative example A2, it is necessary that the value of x is not more than 0.02.

As is clear from the example A1, the example A2, the example A3, and the comparative example A3, it is necessary that the value of α is not less than 0.2.

As is clear from the example A6, the example A7, the example A8, and the comparative example A4, it is necessary that the value of α is not more than 0.5.

Example B

An example similar to the example A was conducted, except that Co was used instead of Fe as Q of the $(1-\alpha)$ (Bi, Na, Ba) $TiO_3$-$\alpha BiQO_3$ layer 15. Table 3 and Table 4 show the results of the example B, which is composed of the example B1—the example B10 and the comparative example B1—the comparative example B4. FIG. 13-FIG. 16 correspond to FIG. 2-FIG. 5, respectively.

TABLE 3

| | M | x | α | Orientation direction | (001) Peak intensity (cps) |
|---|---|---|---|---|---|
| | | | | Q = Co | |
| Example B1 | Pt | 0.01 | 0.20 | only (001) | 110,881 |
| Example B2 | Pt | 0.002 | 0.20 | only (001) | 73,154 |
| Example B3 | Pt | 0.02 | 0.20 | only (001) | 79,397 |
| Example B4 | Pt | 0.01 | 0.30 | only (001) | 107,317 |
| Example B5 | Pt | 0.01 | 0.40 | only (001) | 102,915 |
| Example B6 | Pt | 0.01 | 0.50 | only (001) | 90,104 |
| Example B7 | Pt | 0.002 | 0.50 | only (001) | 63,223 |
| Example B8 | Pt | 0.02 | 0.50 | only (001) | 65,956 |

TABLE 3-continued

Q = Co

| | M | x | α | Orientation direction | (001) Peak intensity (cps) |
|---|---|---|---|---|---|
| Example B9 | Ir | 0.01 | 0.20 | only (001) | 89,98 |
| Example B10 | $Pt_{0.5}Ir_{0.5}$ | 0.01 | 0.20 | only (001) | 97,695 |
| Comparative example B1 | Pt | 0 | 0.20 | (001) and (110) | 24,061 |
| Comparative example B2 | Pt | 0.05 | 0.20 | (001) and (110) | 38,183 |
| Comparative example B3 | Pt | 0.01 | 0.10 | only (001) | 117,357 |
| Comparative example B4 | Pt | 0.01 | 0.60 | only (001) | 36,389 |

TABLE 4

Q = Co

| | Dielectric loss (tan δ) | Polarization-disappear temperature Td (degree Celsius) | Piezoelectric constant d31 |
|---|---|---|---|
| Example B1 | 3.4% | 190 | −104 pC/N |
| Example B2 | 4.8% | 187 | −85 pC/N |
| Example B3 | 5.2% | 188 | −88 pC/N |
| Example B4 | 3.8% | 211 | −101 pC/N |
| Example B5 | 4.2% | 230 | −96 pC/N |
| Example B6 | 4.7% | 253 | −94 pC/N |
| Example B7 | 6.1% | 228 | −82 pC/N |
| Example B8 | 6.5% | 225 | −85 pC/N |
| Example B9 | 3.5% | 189 | −97 pC/N |
| Example B10 | 3.4% | 190 | −99 pC/N |
| Comparative example B1 | 43% | 154 | −34 pC/N |
| Comparative example B2 | 22% | 161 | −60 pC/N |
| Comparative example B3 | 3.2% | 139 | −95 pC/N |
| Comparative example B4 | 26% | 172 | −57 pC/N |

Similarly to the example A, as is clear from Table 3 and Table 4, if both of the following items (a) and (b) are satisfied, the $(1-\alpha)$ (Bi, Na, Ba) $TiO_3$-$\alpha BiQO_3$ layer 15 (Q=Co) has high crystalline orientation, low dielectric loss, high polarization-disappear temperature, and high piezoelectric constant.

(a) the value of x is not less than 0.002 and not more than 0.02.

(b) the value of α is not less than 0.2 and not more than 0.5.

Example C

An example similar to the example A was conducted, except that $Zn_{0.5}Ti_{0.5}$ was used instead of Fe as Q of the $(1-\alpha)$ (Bi, Na, Ba) $TiO_3$-$\alpha BiQO_3$ layer 15. Table 5 and Table 6 show the results of the example C, which is composed of the example C1—the example C10 and the comparative example C1—the comparative example C4. FIG. 17-FIG. 20 correspond to FIG. 2-FIG. 5, respectively.

TABLE 5

Q = $Zn_{0.5}Ti_{0.5}$

| | M | x | α | Orientation direction | (001) Peak intensity (cps) |
|---|---|---|---|---|---|
| Example C1 | Pt | 0.01 | 0.20 | only (001) | 116,707 |
| Example C2 | Pt | 0.002 | 0.20 | only (001) | 77,065 |
| Example C3 | Pt | 0.02 | 0.20 | only (001) | 83,552 |
| Example C4 | Pt | 0.01 | 0.30 | only (001) | 113,658 |
| Example C5 | Pt | 0.01 | 0.40 | only (001) | 108,698 |
| Example C6 | Pt | 0.01 | 0.50 | only (001) | 94,381 |
| Example C7 | Pt | 0.002 | 0.50 | only (001) | 64,509 |
| Example C8 | Pt | 0.02 | 0.50 | only (001) | 67,742 |
| Example C9 | Ir | 0.01 | 0.20 | only (001) | 93,645 |
| Example C10 | $Pt_{0.5}Ir_{0.5}$ | 0.01 | 0.20 | only (001) | 105,506 |
| Comparative example C1 | Pt | 0 | 0.20 | (001) and (110) | 25,832 |
| Comparative example C2 | Pt | 0.05 | 0.20 | (001) and (110) | 40,339 |
| Comparative example C3 | Pt | 0.01 | 0.10 | only (001) | 123,258 |
| Comparative example C4 | Pt | 0.01 | 0.60 | only (001) | 38,933 |

TABLE 6

Q = $Zn_{0.5}Ti_{0.5}$

| | Dielectric loss (tan δ) | Polarization-disappear temperature Td (degree Celsius) | Piezoelectric constant d31 |
|---|---|---|---|
| Example C1 | 2.5% | 189 | −105 pC/N |
| Example C2 | 3.5% | 186 | −86 pC/N |
| Example C3 | 3.8% | 187 | −89 pC/N |
| Example C4 | 2.8% | 210 | −102 pC/N |
| Example C5 | 3.1% | 229 | −97 pC/N |
| Example C6 | 3.5% | 251 | −95 pC/N |
| Example C7 | 4.6% | 226 | −83 pC/N |
| Example C8 | 4.9% | 224 | −86 pC/N |
| Example C9 | 2.6% | 188 | −98 pC/N |
| Example C10 | 2.5% | 188 | −101 pC/N |
| Comparative example C1 | 32% | 153 | −35 pC/N |
| Comparative example C2 | 16% | 161 | −60 pC/N |
| Comparative example C3 | 2.3% | 139 | −96 pC/N |
| Comparative example C4 | 20% | 171 | −57 pC/N |

Similarly to the example A, as is clear from Table 5 and Table 6, if both of the following items (a) and (b) are satisfied, the $(1-\alpha)$ (Bi, Na, Ba) $TiO_3$-$\alpha BiQO_3$ layer 15 (Q=$Zn_{0.5}Ti_{0.5}$) has high crystalline orientation, low dielectric loss, high polarization-disappear temperature, and high piezoelectric constant.

(a) the value of x is not less than 0.002 and not more than 0.02.

(b) the value of α is not less than 0.2 and not more than 0.5.

Example D

An example similar to the example A was conducted, except that $Mg_{0.5}Ti_{0.5}$ was used instead of Fe as Q of the $(1-\alpha)$ (Bi, Na, Ba) $TiO_3$-$\alpha BiQO_3$ layer 15. Table 7 and Table 8 show the results of the example D, which is composed of the example D1—the example D10 and the comparative example D1—the comparative example D4. FIG. 21-FIG. 24 correspond to FIG. 2-FIG. 5, respectively.

TABLE 7

$Q = Mg_{0.5}Ti_{0.5}$

| | M | x | α | Orientation direction | (001) Peak intensity (cps) |
|---|---|---|---|---|---|
| Example D1 | Pt | 0.01 | 0.20 | only (001) | 114,984 |
| Example D2 | Pt | 0.002 | 0.20 | only (001) | 76,398 |
| Example D3 | Pt | 0.02 | 0.20 | only (001) | 81,901 |
| Example D4 | Pt | 0.01 | 0.30 | only (001) | 112,128 |
| Example D5 | Pt | 0.01 | 0.40 | only (001) | 106,356 |
| Example D6 | Pt | 0.01 | 0.50 | only (001) | 92,730 |
| Example D7 | Pt | 0.002 | 0.50 | only (001) | 63,696 |
| Example D8 | Pt | 0.02 | 0.50 | only (001) | 67,259 |
| Example D9 | Ir | 0.01 | 0.20 | only (001) | 92,355 |
| Example D10 | $Pt_{0.5}Ir_{0.5}$ | 0.01 | 0.20 | only (001) | 103,231 |
| Comparative example D1 | Pt | 0 | 0.20 | (001) and (110) | 25,131 |
| Comparative example D2 | Pt | 0.05 | 0.20 | (001) and (110) | 39,108 |
| Comparative example D3 | Pt | 0.01 | 0.10 | only (001) | 121,852 |
| Comparative example D4 | Pt | 0.01 | 0.60 | only (001) | 67,259 |

TABLE 8

$Q = Mg_{0.5}Ti_{0.5}$

| | Dielectric loss (tan δ) | Polarization-disappear temperature Td (degree Celsius) | Piezoelectric constant d31 |
|---|---|---|---|
| Example D1 | 2.5% | 189 | −105 pC/N |
| Example D2 | 3.6% | 186 | −87 pC/N |
| Example D3 | 3.9% | 187 | −89 pC/N |
| Example D4 | 2.9% | 211 | −102 pC/N |
| Example D5 | 3.2% | 230 | −98 pC/N |
| Example D6 | 3.6% | 252 | −96 pC/N |
| Example D7 | 4.6% | 227 | −83 pC/N |
| Example D8 | 5.0% | 225 | −87 pC/N |
| Example D9 | 2.6% | 188 | −99 pC/N |
| Example D10 | 2.5% | 189 | −101 pC/N |
| Comparative example D1 | 32% | 153 | −35 pC/N |
| Comparative example D2 | 16% | 161 | −61 pC/N |
| Comparative example D3 | 2.4% | 139 | −97 pC/N |
| Comparative example D4 | 19% | 171 | −58 pC/N |

Similarly to the example A, as is clear from Table 7 and Table 8, if both of the following items (a) and (b) are satisfied, the $(1-\alpha)(Bi, Na, Ba)TiO_3$-$\alpha BiQO_3$ layer 15 ($Q=Mg_{0.5}Ti_{0.5}$) has high crystalline orientation, low dielectric loss, high polarization-disappear temperature, and high piezoelectric constant.

(a) the value of x is not less than 0.002 and not more than 0.02.

(b) the value of α is not less than 0.2 and not more than 0.5.

The ink jet head, the angular velocity sensor, and the piezoelectric generating element of the present invention each comprising the above-mentioned piezoelectric film are described. For more detail, see International publication No. 2010/047049. U.S. Pat. No. 7,870,787 and Chinese Laid-open patent application publication No. 101981718 are the United States patent publication and the Chinese laid-open patent application publication which correspond to International publication No. 2010/047049, respectively.

[Ink Jet Head]

An ink jet head of the present invention will be described below with reference to FIG. 6 to FIG. 8.

Figure 6:
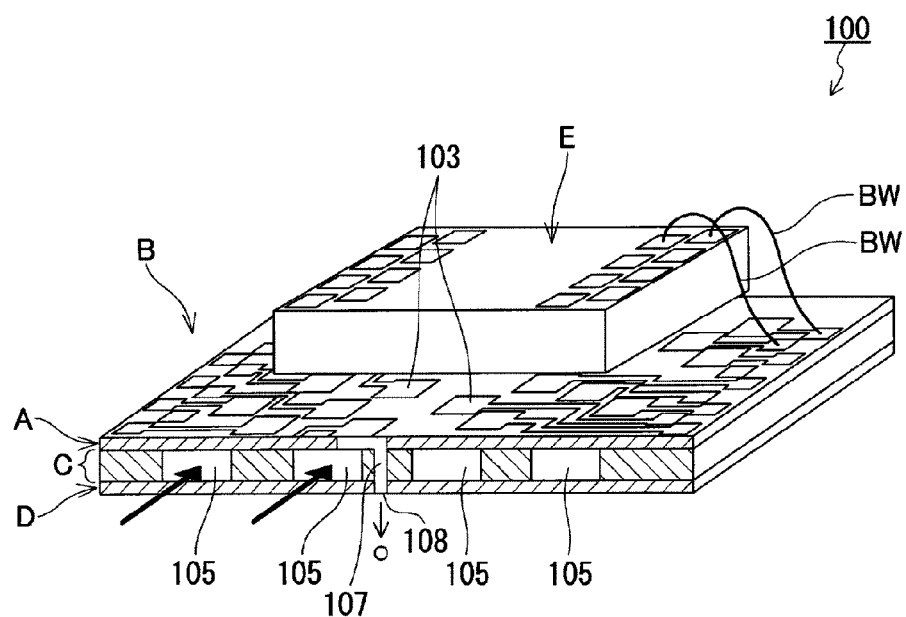
FIG. 6 is a perspective view schematically showing an example of an ink jet head of the present invention and partially showing a cross section of the ink jet head.

FIG. 6 shows one embodiment of the ink jet head of the present invention. FIG. 7 is an exploded view showing main parts including a pressure chamber member and an actuator part in an ink jet head 100 shown in FIG. 6.

Figure 7:
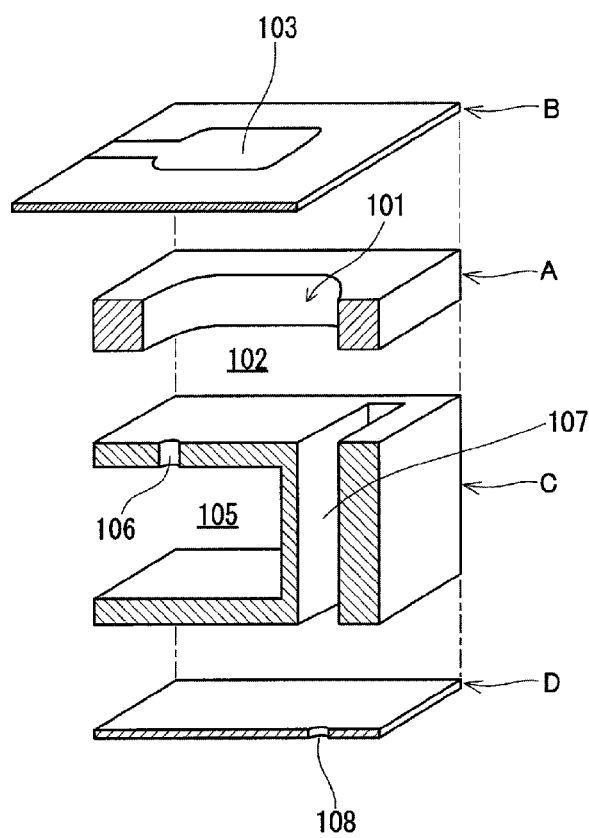
FIG. 7 is an exploded perspective view schematically showing main parts including a pressure chamber member and an actuator part in the ink jet head shown in FIG. 6 and partially showing a cross section of the main parts.

A reference character A in FIG. 6 and FIG. 7 indicates a pressure chamber member. The pressure chamber member A includes through-holes 101 that penetrate therethrough in its thickness direction (in the vertical direction in these diagrams). The through-hole 101 shown in FIG. 7 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 6 and FIG. 7, a reference numeral 103 indicates an individual electrode layer that is a part of the piezoelectric film. As shown in FIG. 6, in the ink jet head 100, a plurality of individual electrode layers 103, that is, piezoelectric films are arranged in a zigzag pattern in plan view.

The ink passage member C has a plurality of common liquid chambers 105 arranged in stripes in plan view. In FIG. 6 and FIG. 7, each of the common liquid chambers 105 is aligned over a plurality of pressure chambers 102 in plan view. The common liquid chambers 105 extend in the ink supply direction (in the direction indicated by arrows in FIG. 6) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through a corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 6, a reference character E indicates an IC chip. The IC chip E is connected electrically to the individual electrode layers 103, which are exposed on the surface of the actuator part B, through bonding wires BW. For simplicity of FIG. 6, only a part of the bonding wires BW are shown in FIG. 6.

FIG. 7 shows the configuration of the main parts including the pressure chamber member A and the actuator part B. FIG. 8 shows the cross section perpendicular to the ink supply direction (in the direction indicated by the arrows in FIG. 6) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

Figure 8:
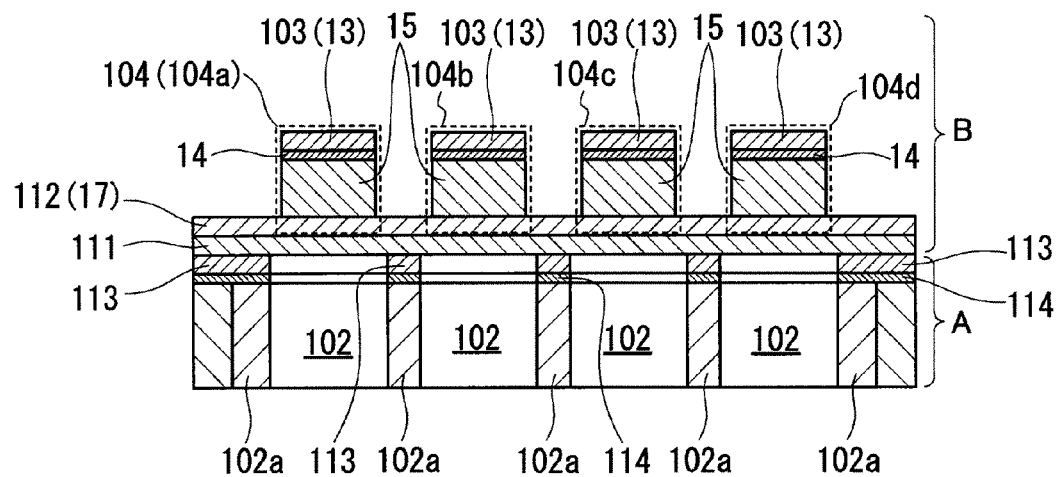
FIG. 8 is a cross-sectional view schematically showing an example of the main parts including the pressure chamber member and the actuator part in the ink jet head shown in FIG. 6.

As surrounded by the dashed-line in FIG. 8, the above-mentioned piezoelectric films 104 are arranged in the ink jet head. The piezoelectric film is the piezoelectric film described in the item titled as "Piezoelectric film".

[Image Forming Method by Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method of forming an image, a letter, a picture, or a figure is printed to a print target such as a sheet of paper. With this method, a picturesque image can be printed.

[Angular Velocity Sensor]

Figure 9:
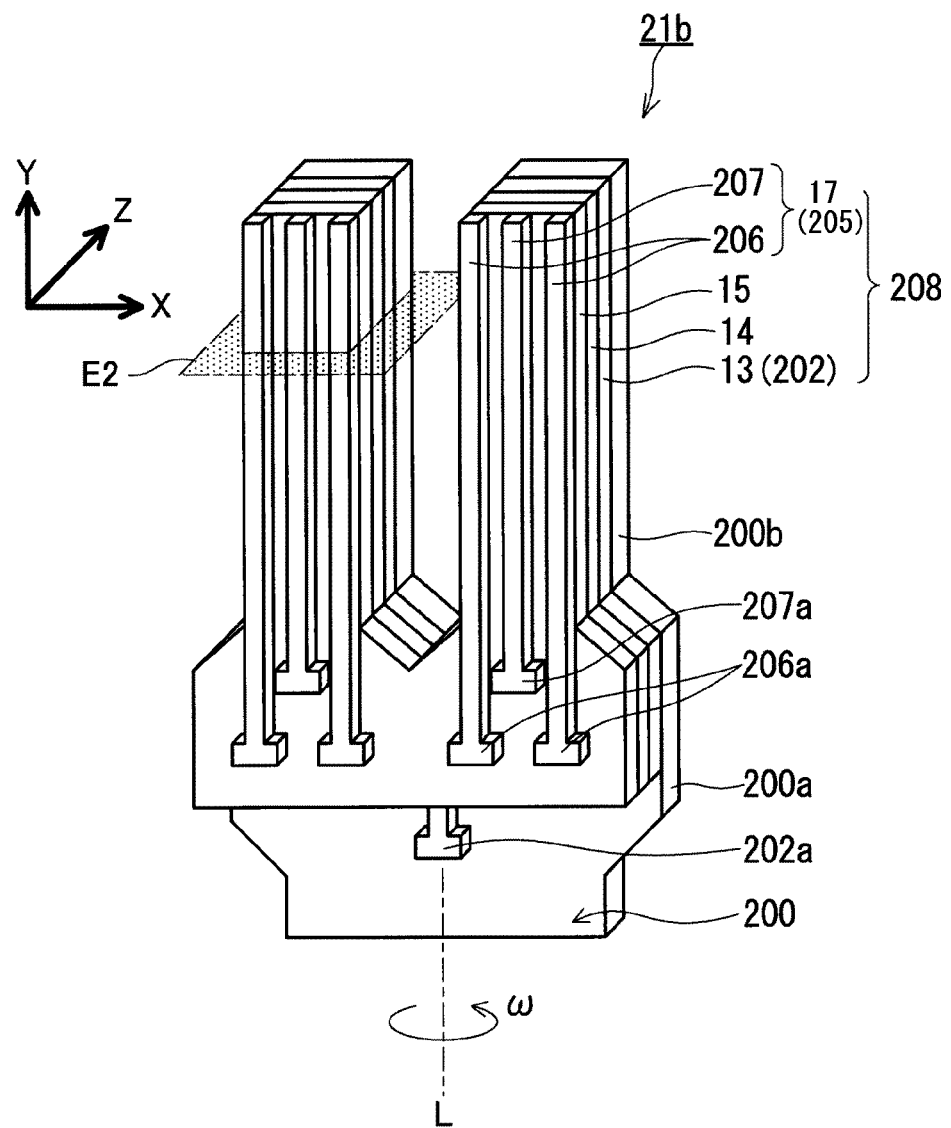
FIG. 9 is a perspective view schematically showing an example of an angular velocity sensor of the present invention.
Figure 10:
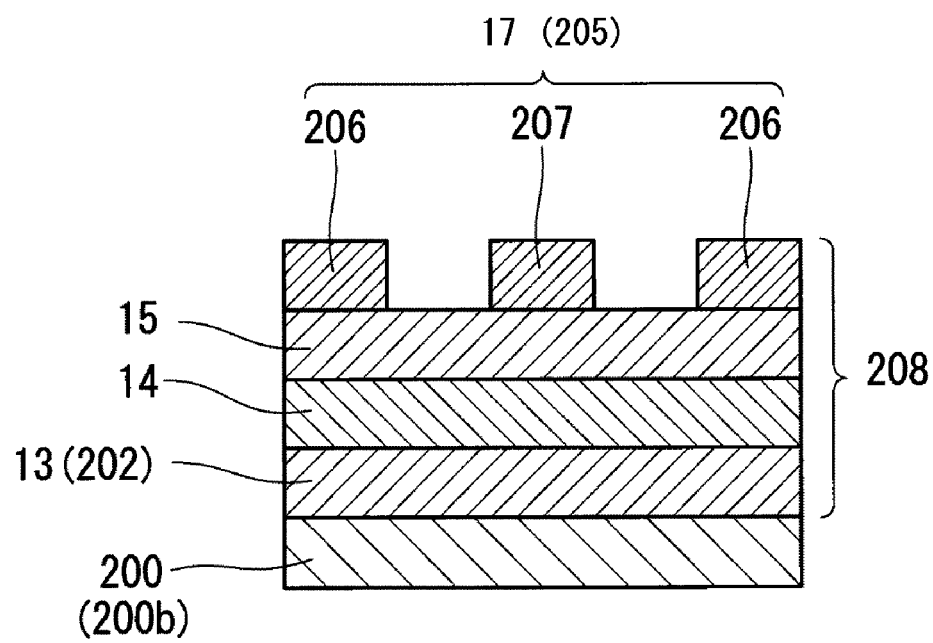
FIG. 10 is a cross-sectional view showing a cross section E1 of the angular velocity sensor shown in FIG. 9.

FIG. 9 shows an example of an angular velocity sensor of the present invention. FIG. 10 shows a cross section E1 of an angular velocity sensor 21a shown in FIG. 9. The angular velocity sensor 21a shown in FIG. 9 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 9 comprises a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. More specifically, it is the Y direction in FIG. 9. The substrate 200 has a shape of a tuning fork including two arms (vibration parts 200b), when viewed from the thickness direction of the substrate 200 (the Z direction in FIG. 9).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric film described in the item titled as "Piezoelectric film". As shown in FIG. 9 and FIG. 10, the piezoelectric film 208 comprises the first electrode 13 (202), the piezoelectric layer 15, and the second electrode layer 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 9). More particularly, in the angular velocity sensor shown in FIG. 9, a pair of drive electrodes 206 are provided on both of the width-direction edge portions of the vibration part 200b along the length direction thereof (the Y direction in FIG. 9). Only one drive electrode 206 may be provided on one of the width-direction edge portions of the vibration part 200b. In the angular velocity sensor shown in FIG. 9, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 9).

In the angular velocity sensor of the present invention, one of the first electrode and the second electrode selected therefrom can be composed of an electrode group including the drive electrode and the sense electrode. In the angular velocity sensor 21a shown in FIG. 9, the second electrode 205 is composed of the electrode group. Unlike this angular velocity sensor, the first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 9, the connection terminals are provided on the stationary part 200a.

In the angular velocity sensor shown in FIG. 9, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality of central axes of rotation. The angular velocity sensor shown in FIG. 9 has one vibration part group consisting of a pair of vibration parts 200b.

[Method of Measuring Angular Velocity by Angular Velocity Sensor]

The angular velocity measuring method of the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 9 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the drive electrode 206 (in other words, the driving voltage is the potential difference between the first electrode 202 and the drive electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 9). In the angular velocity sensors 21a shown in FIG. 9, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a in which the vibration parts 200b are oscillating, the vibration parts 200b are deflected respectively in their thickness direction (the Z direction) by Coriolis force. In the case where the respective vibration parts 200b are oscillating in the opposite direction mode, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a can be measured by measuring the magnitude of the potential difference.

The following relationship between a Coriolis force Fc and the angular velocity ω is true:

$$Fc = 2mv\omega$$

where v is the velocity of the oscillating vibration part 200b in the oscillation direction, and m is the mass of the vibration part 200b. As shown in this equation, the angular velocity ω can be calculated from the Coriolis force Fc.

[Piezoelectric Generating Element]

Figure 11:
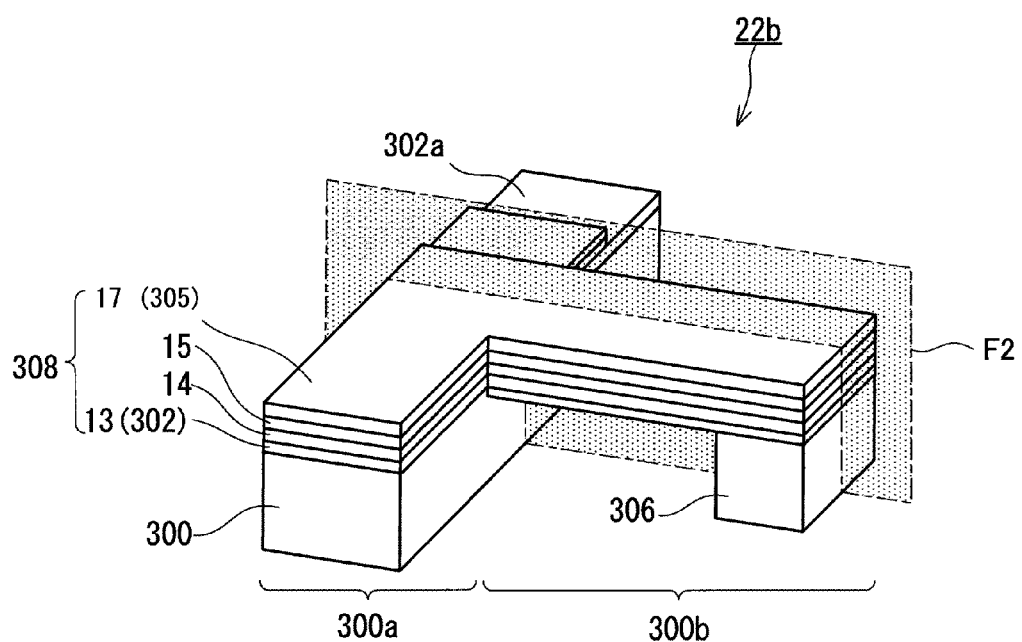
FIG. 11 is a perspective view schematically showing an example of a piezoelectric generating element of the present invention.
Figure 12:
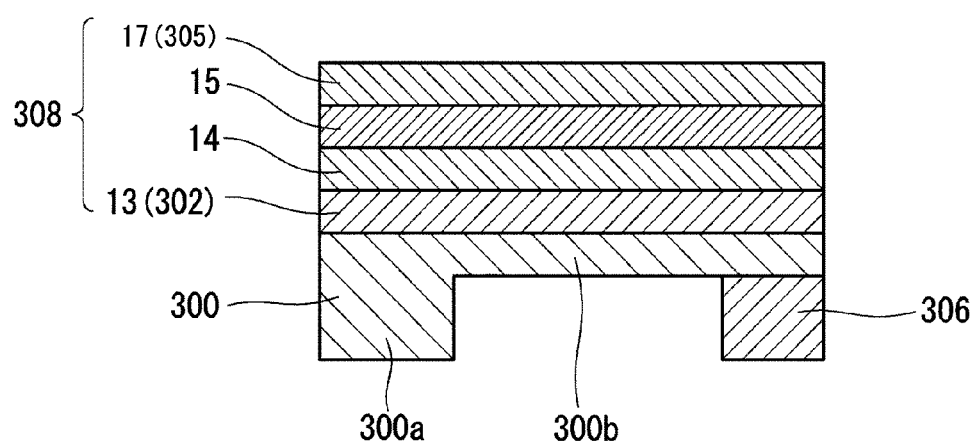
FIG. 12 is a cross-sectional view showing a cross section F1 of the piezoelectric generating element shown in FIG. 11.
Figure 13:
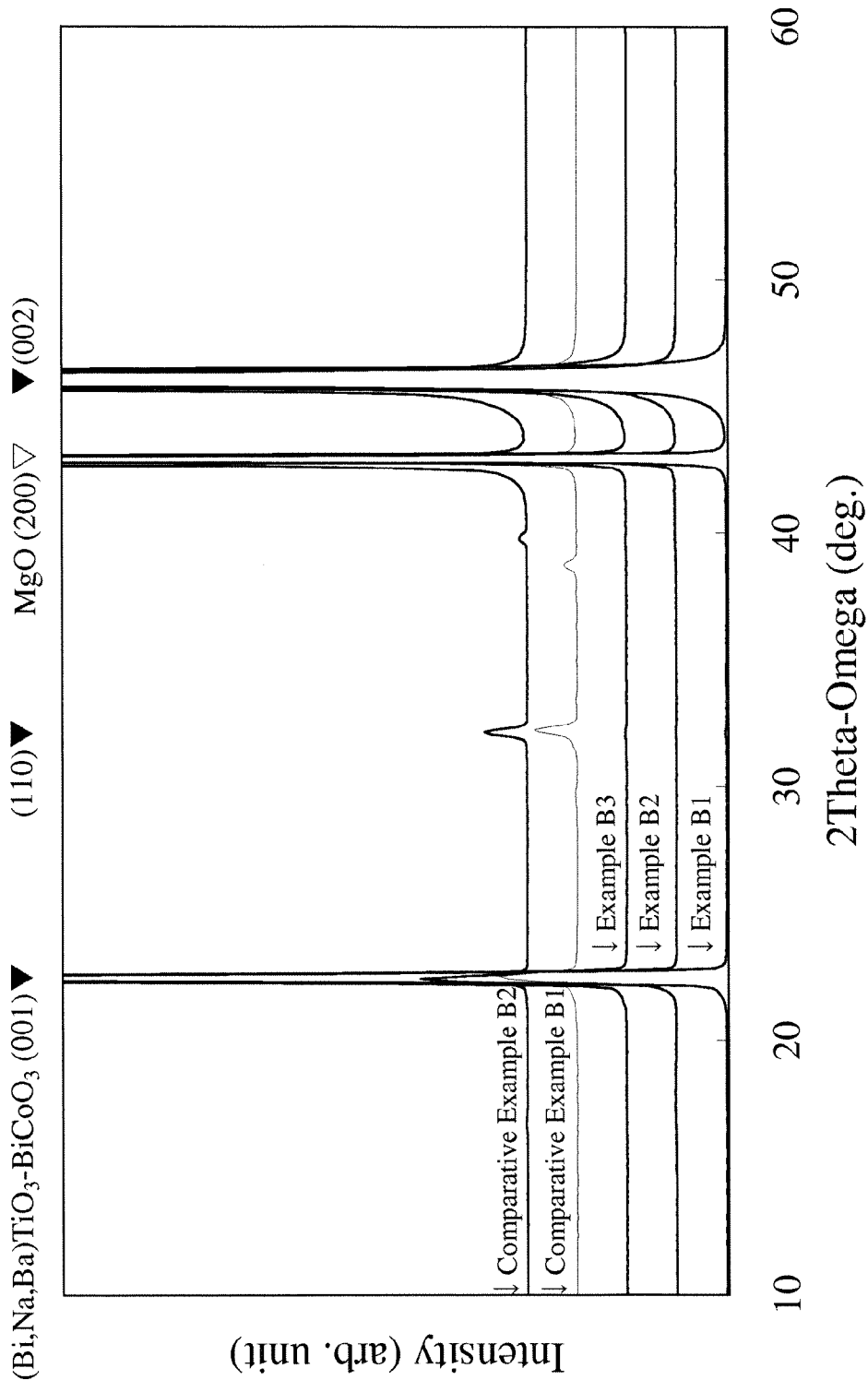
FIG. 13 shows an X-ray diffraction profile of the piezoelectric films according to the example B1—the example B3 and the comparative example B1—the example B2.
Figure 14:
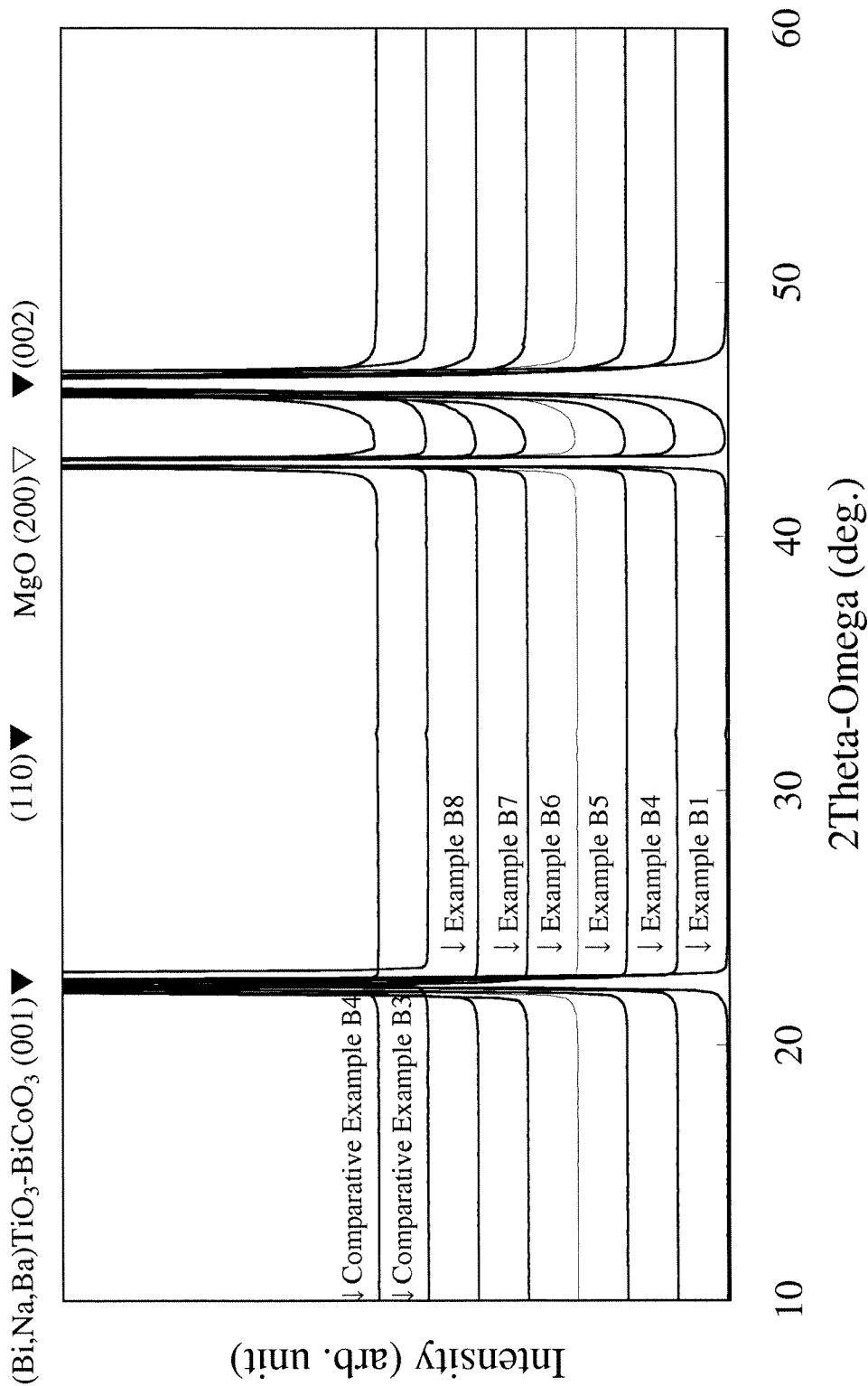
FIG. 14 shows an X-ray diffraction profile of the piezoelectric films according to the example B1, the example B4—the example B8, and the comparative example B3—the comparative example B4.
Figure 15:
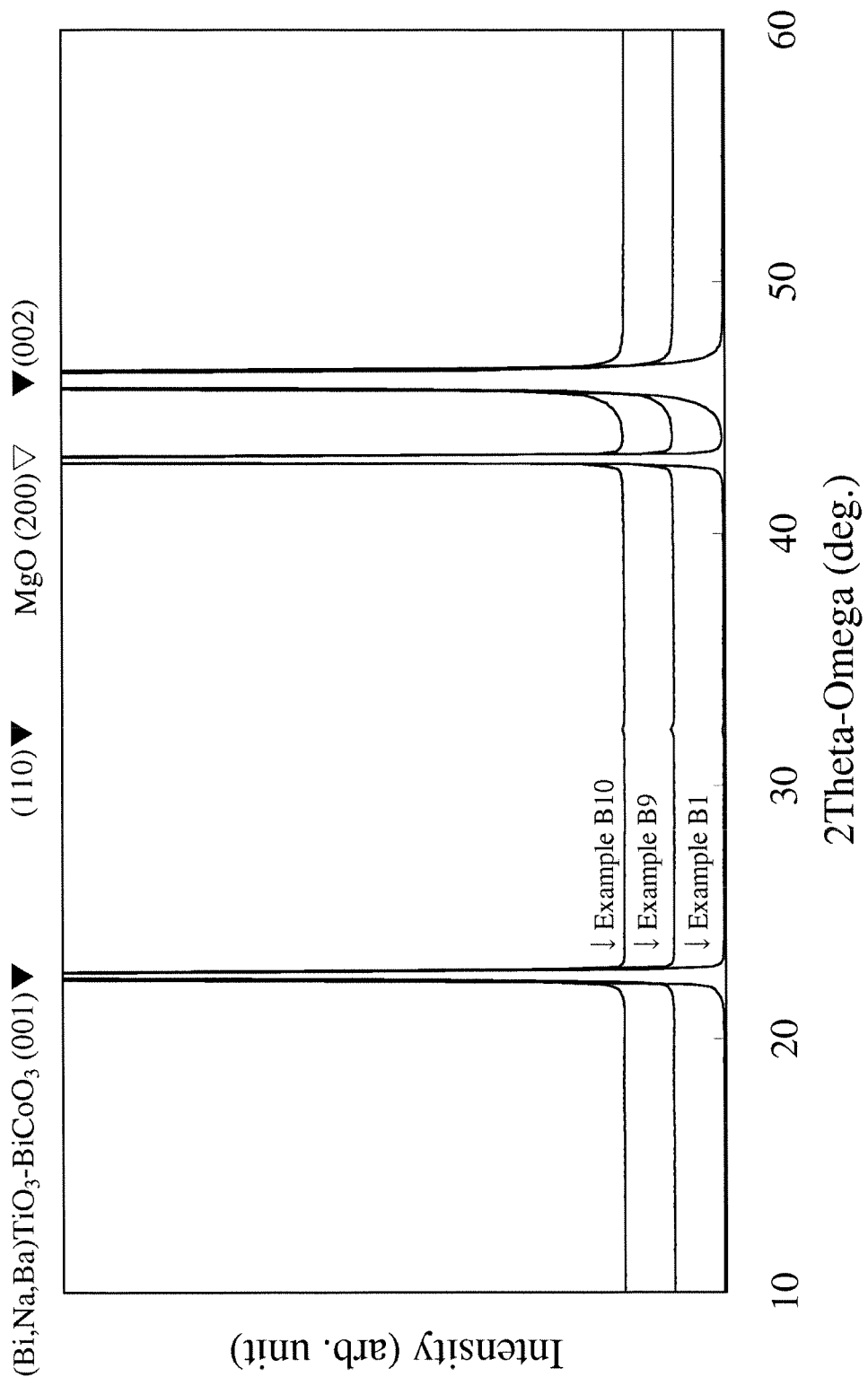
FIG. 15 shows an X-ray diffraction profile of the piezoelectric films according to the example B1, the example B9, and the example B10.
Figure 16:
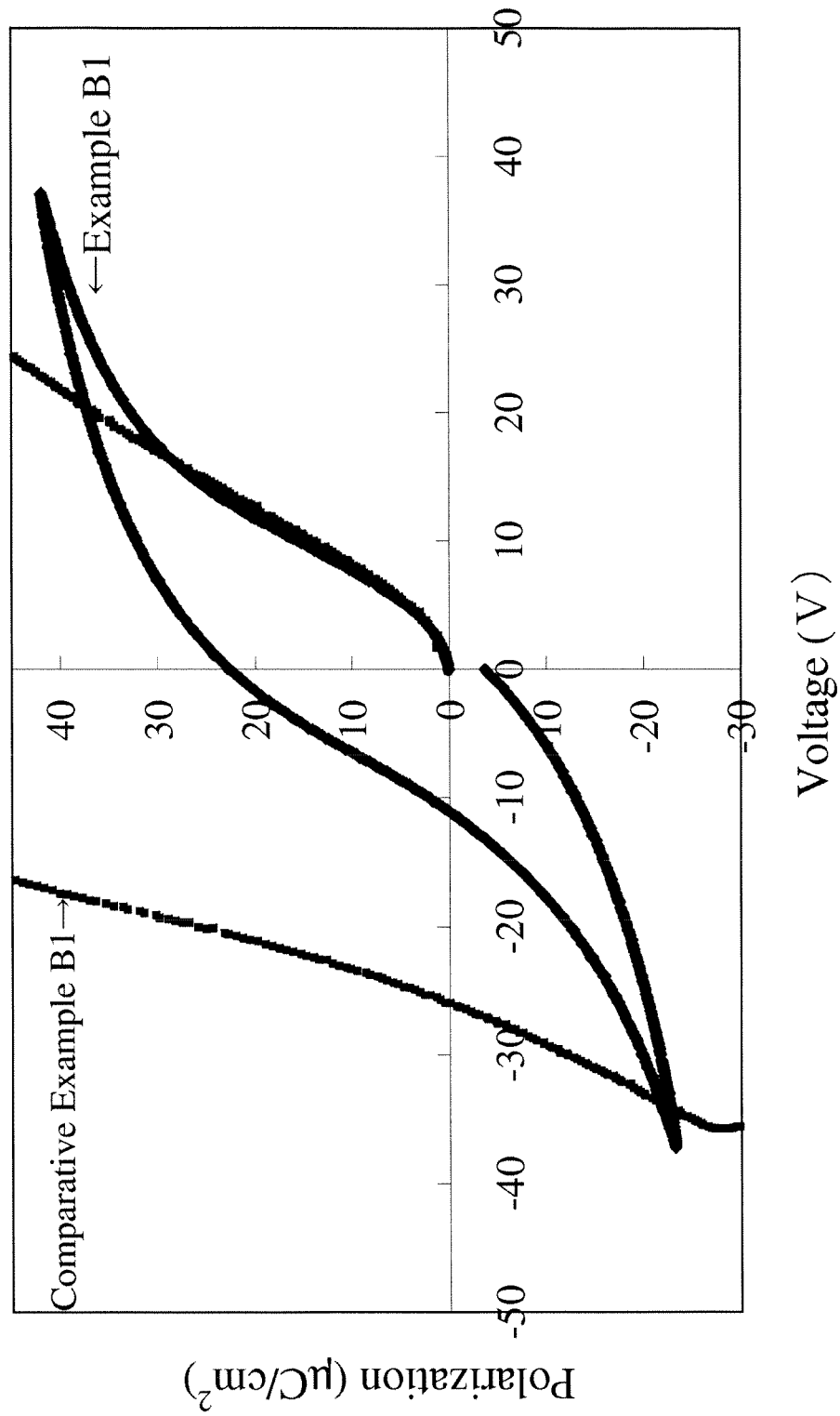
FIG. 16 shows P-E hysteresis curves of the piezoelectric films according to the example B1 and the comparative example B1.
Figure 17:
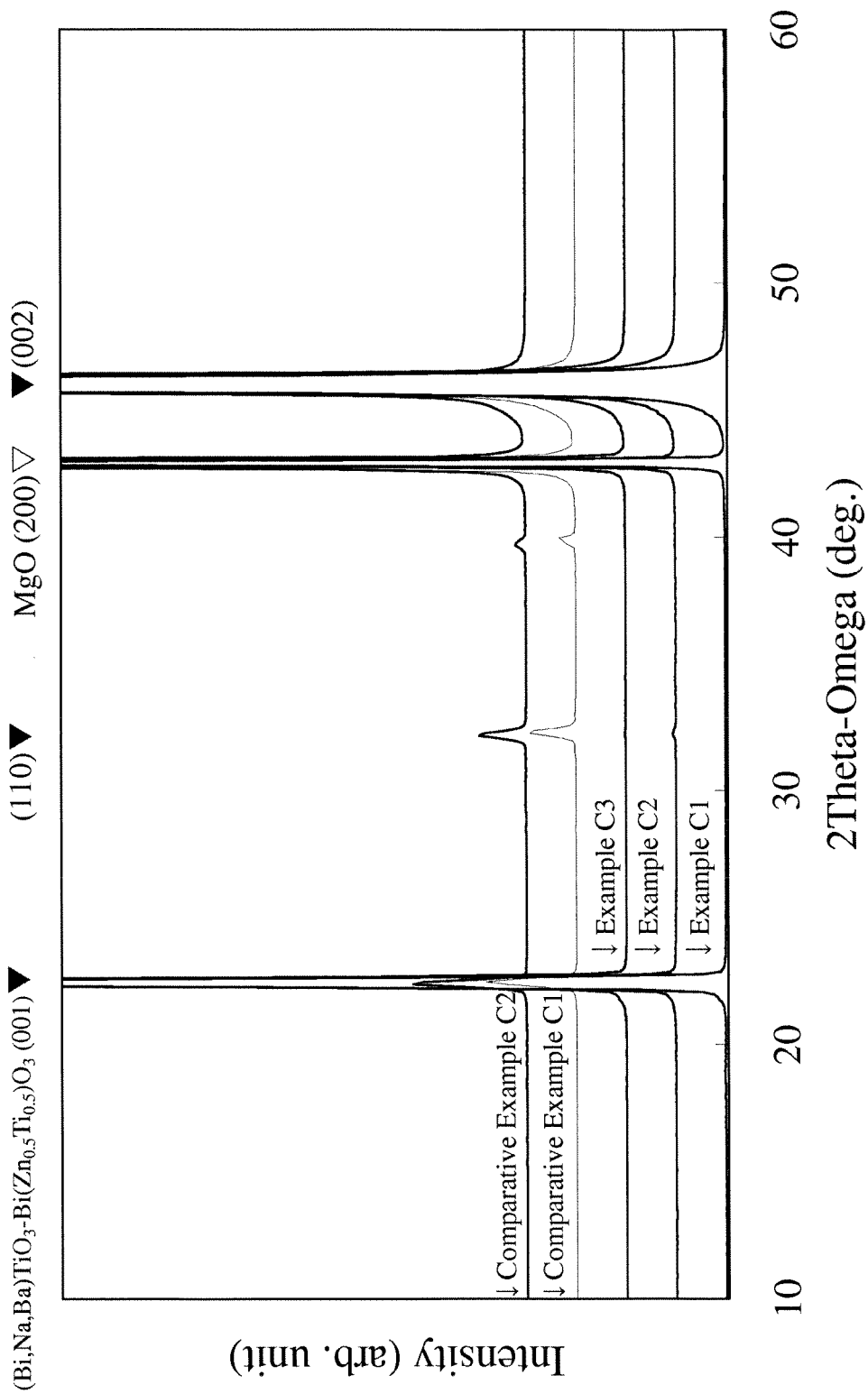
FIG. 17 shows an X-ray diffraction profile of the piezoelectric films according to the example C1—the example C3 and the comparative example C1—the comparative example C2.
Figure 18:
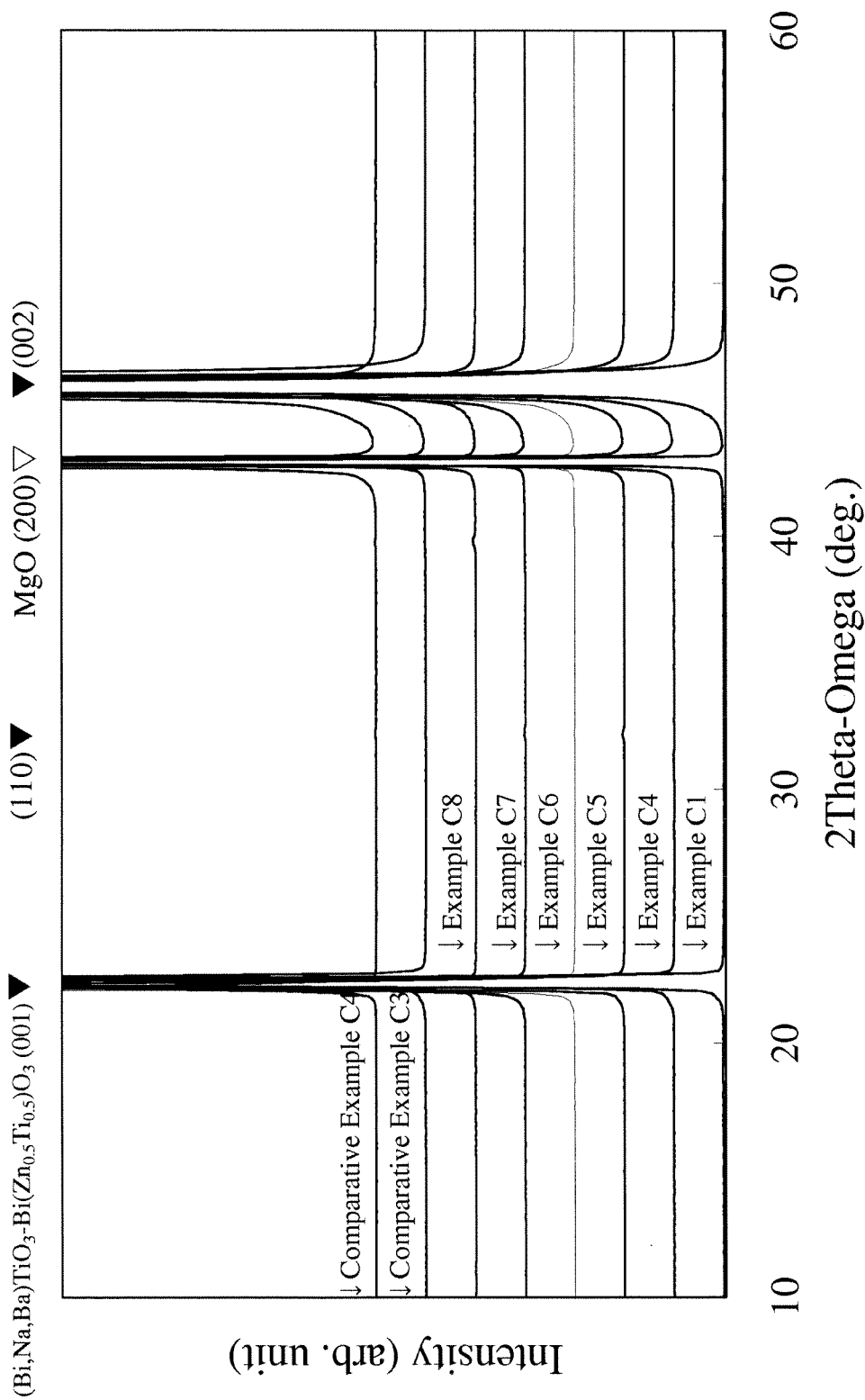
FIG. 18 shows an X-ray diffraction profile of the piezoelectric films according to the example C1, the example C4—the example C8, and the comparative example C3—the comparative example C4.
Figure 19:
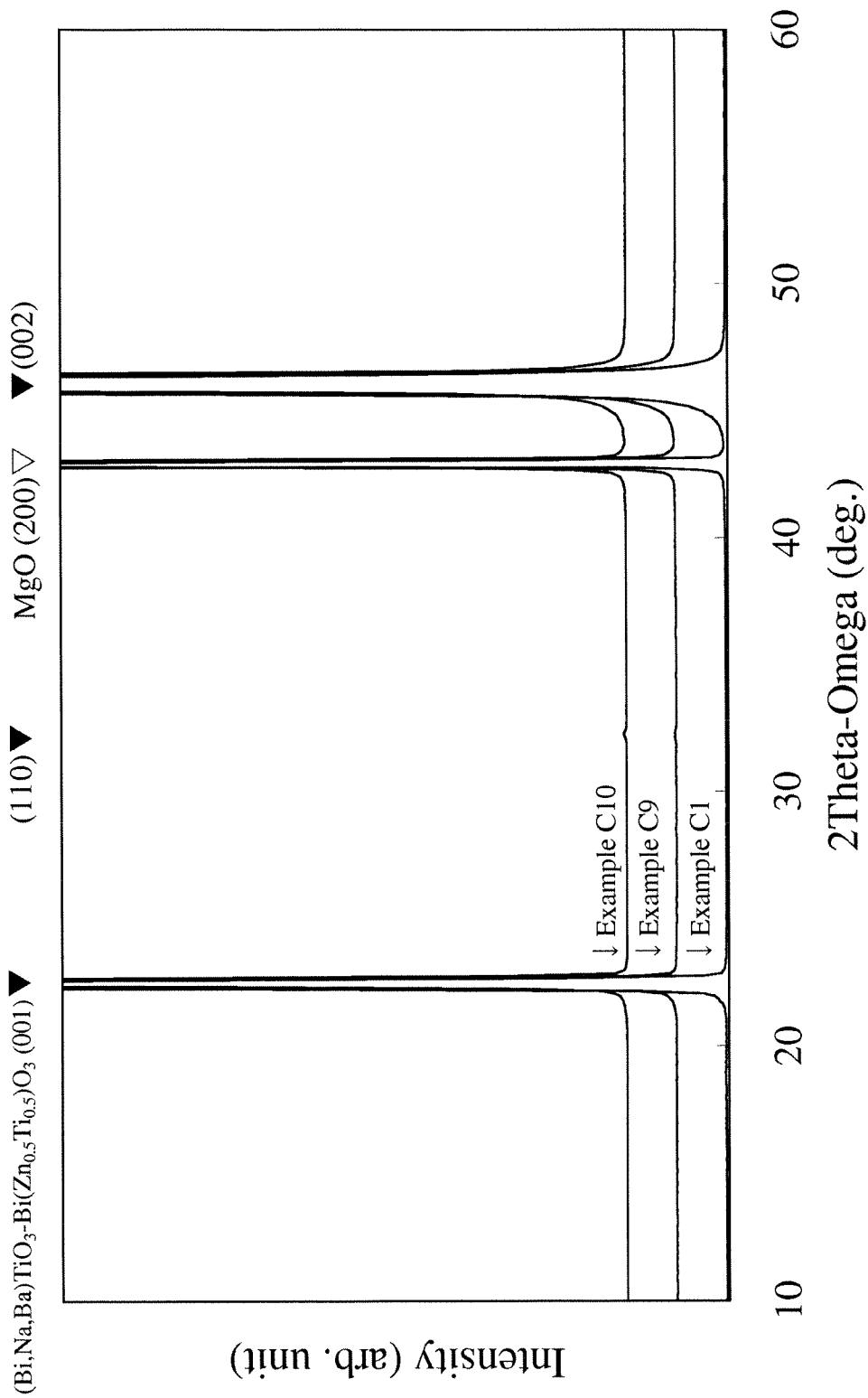
FIG. 19 shows an X-ray diffraction profile of the piezoelectric films according to the example C1, the example C9, and the example C10.
Figure 20:
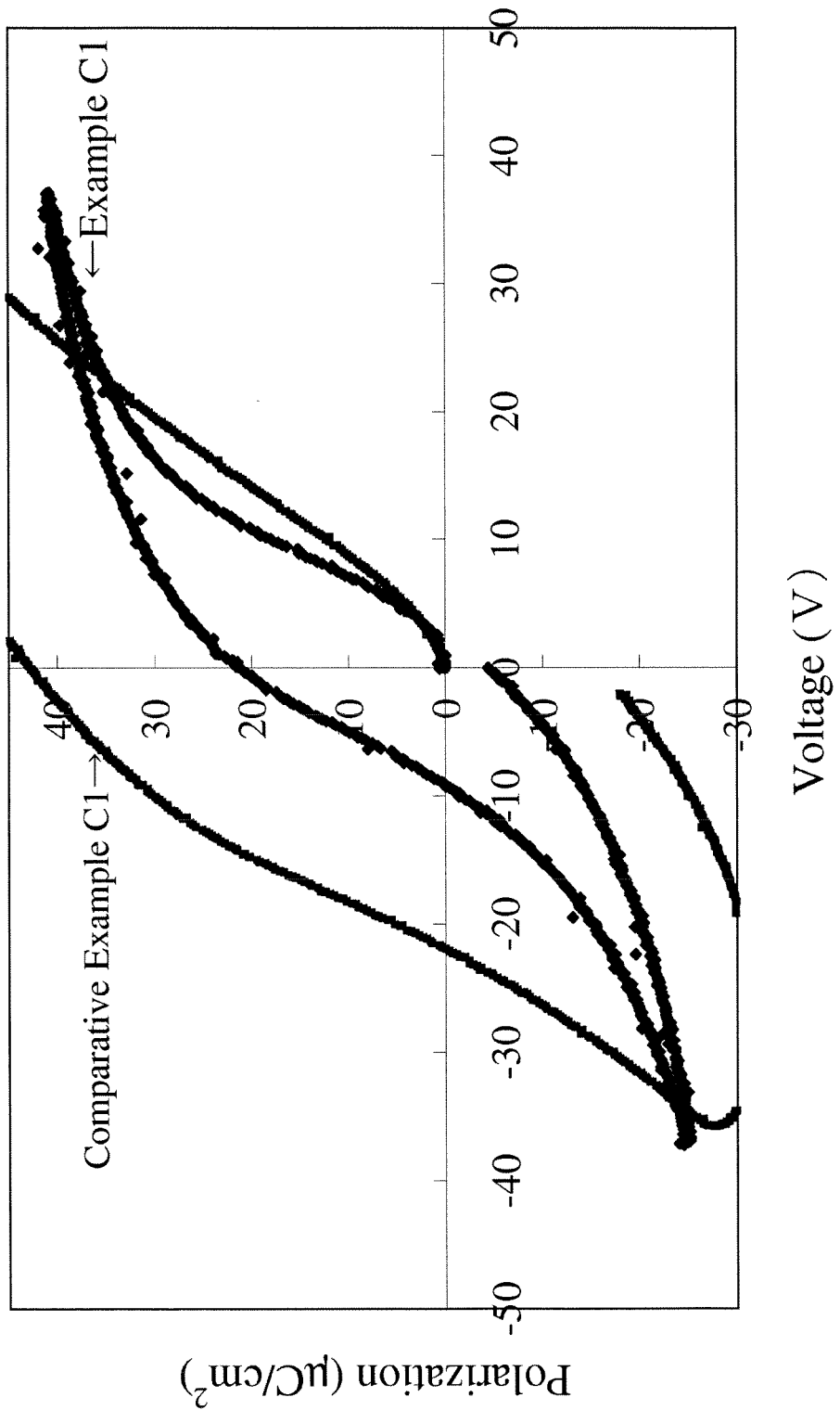
FIG. 20 shows P-E hysteresis curves of the piezoelectric films according to the example C1 and the comparative example C1.
Figure 21:
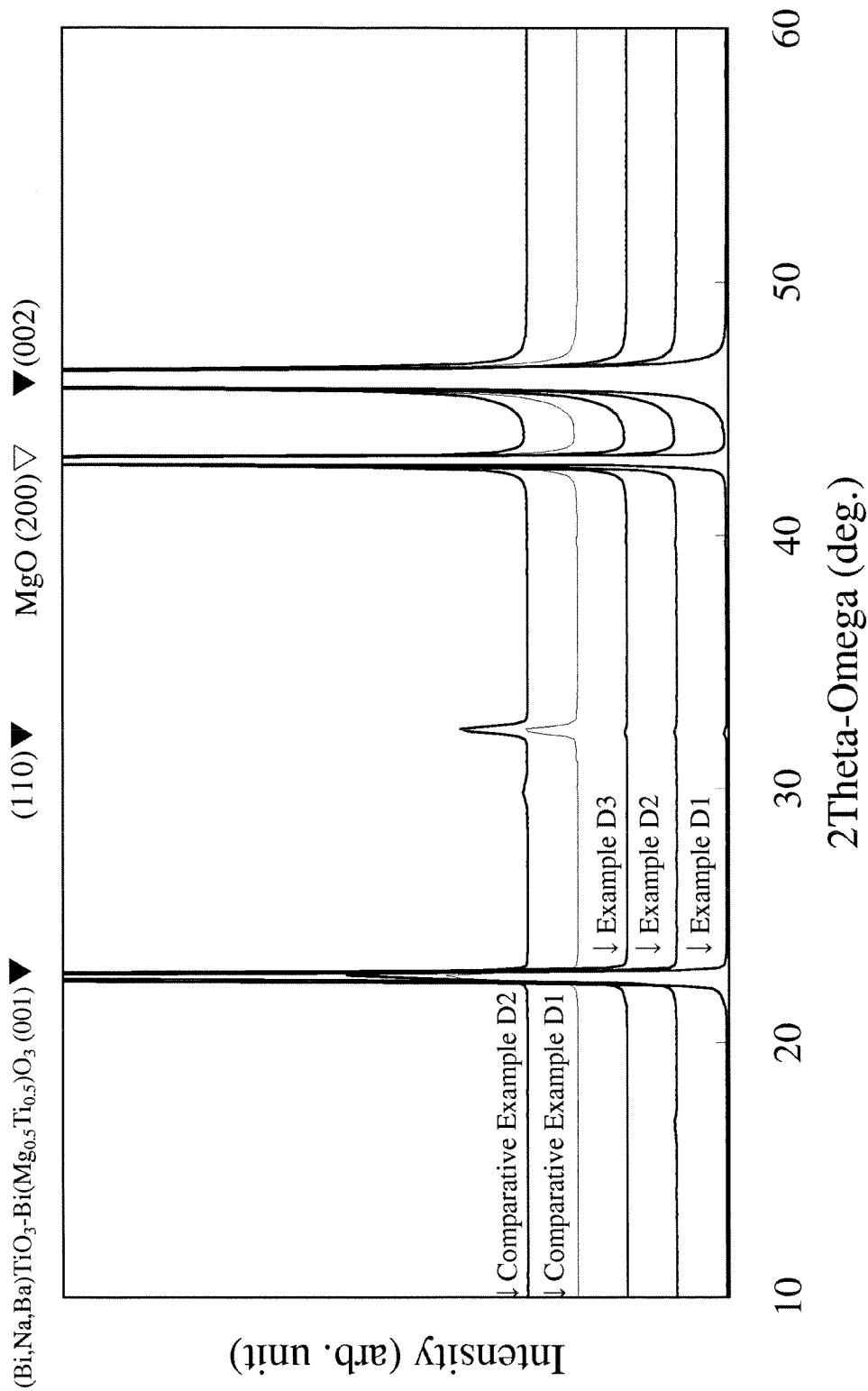
FIG. 21 shows an X-ray diffraction profile of the piezoelectric films according to the example D1—the example D3 and the comparative example D1—the comparative example D2.
Figure 22:
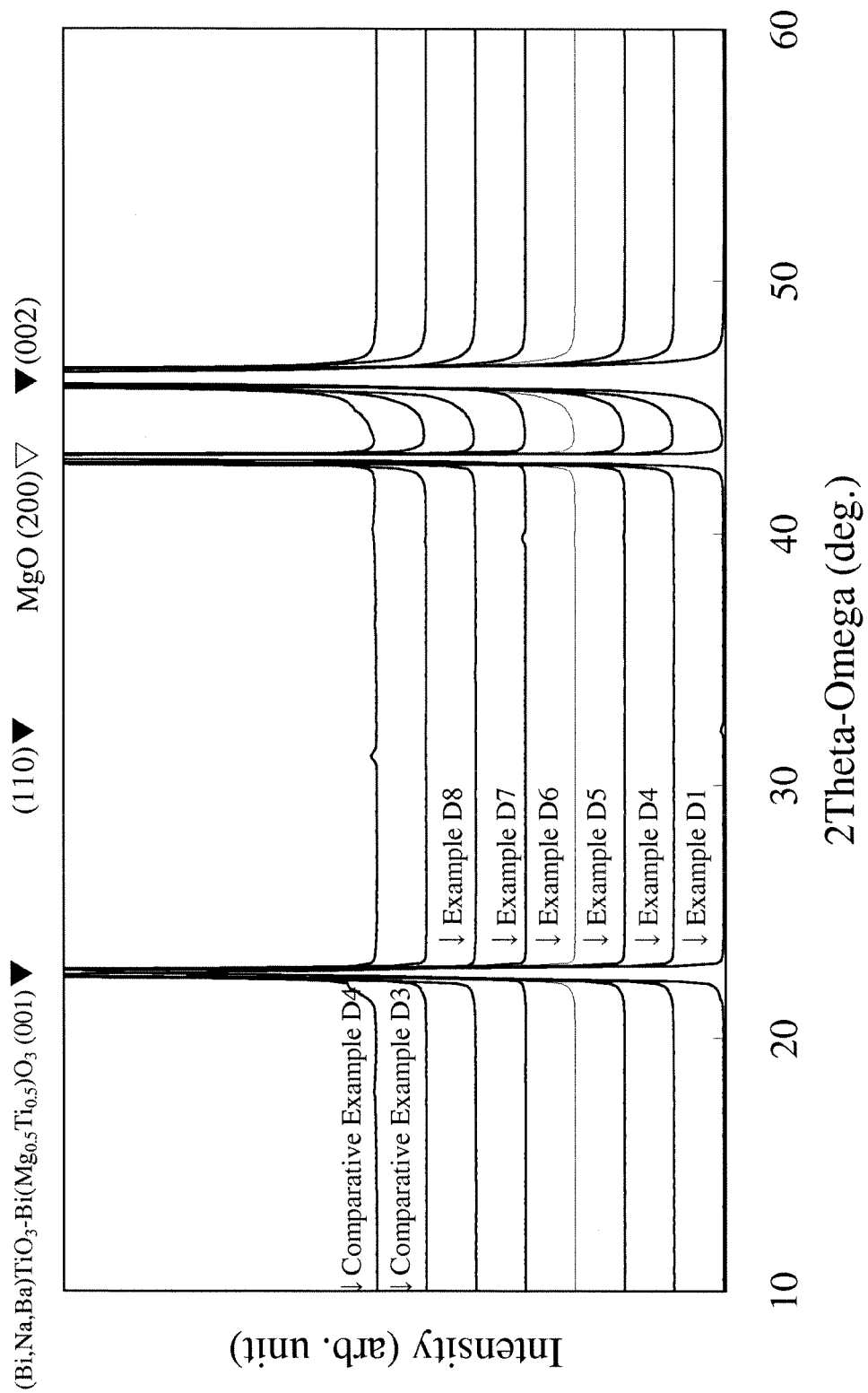
FIG. 22 shows an X-ray diffraction profile of the piezoelectric films according to the example D1, the example D4—the example D8, and the comparative example D3—the comparative example D4.
Figure 23:
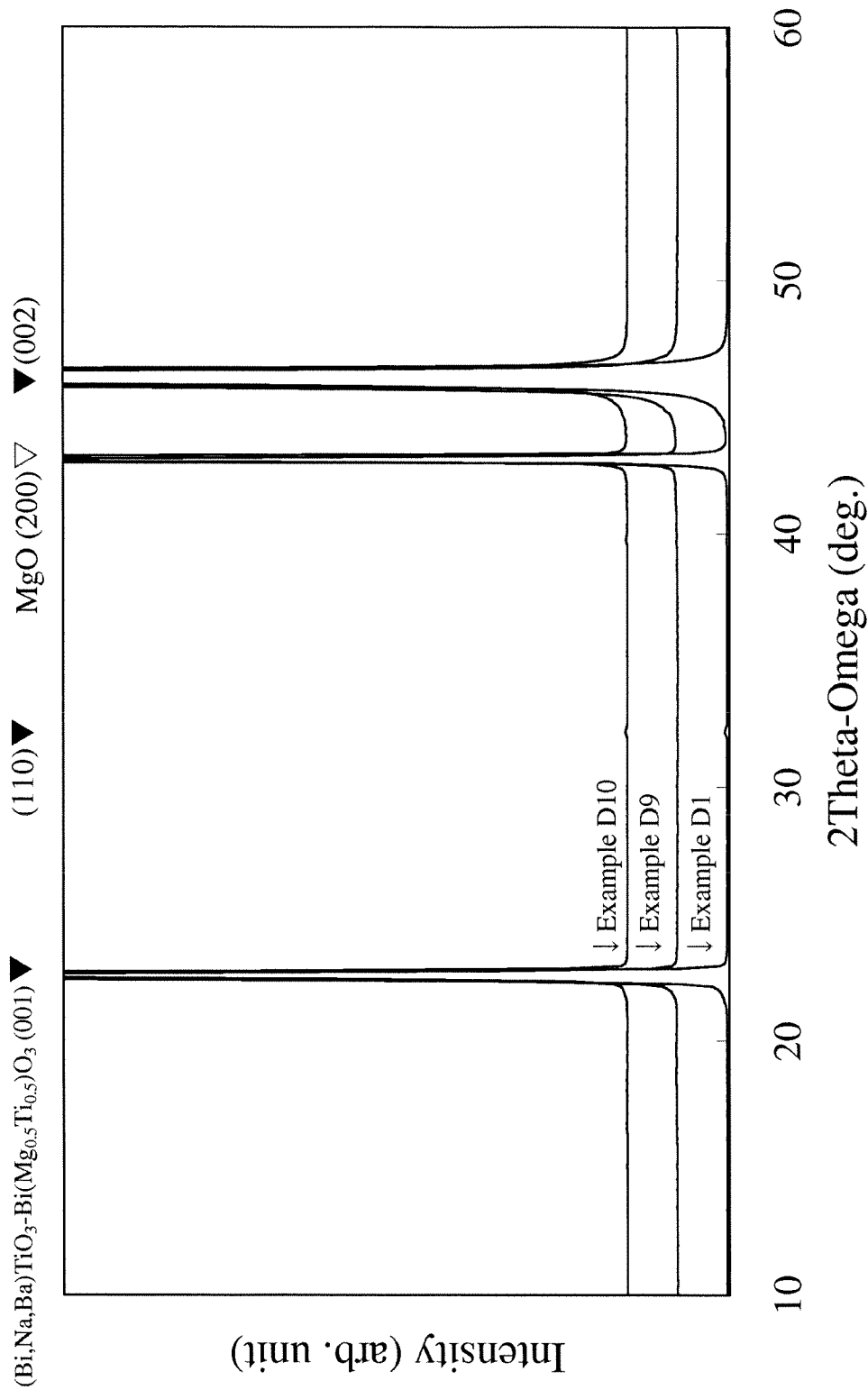
FIG. 23 shows an X-ray diffraction profile of the piezoelectric films according to the example D1, the example D9, and the example D10.
Figure 24:
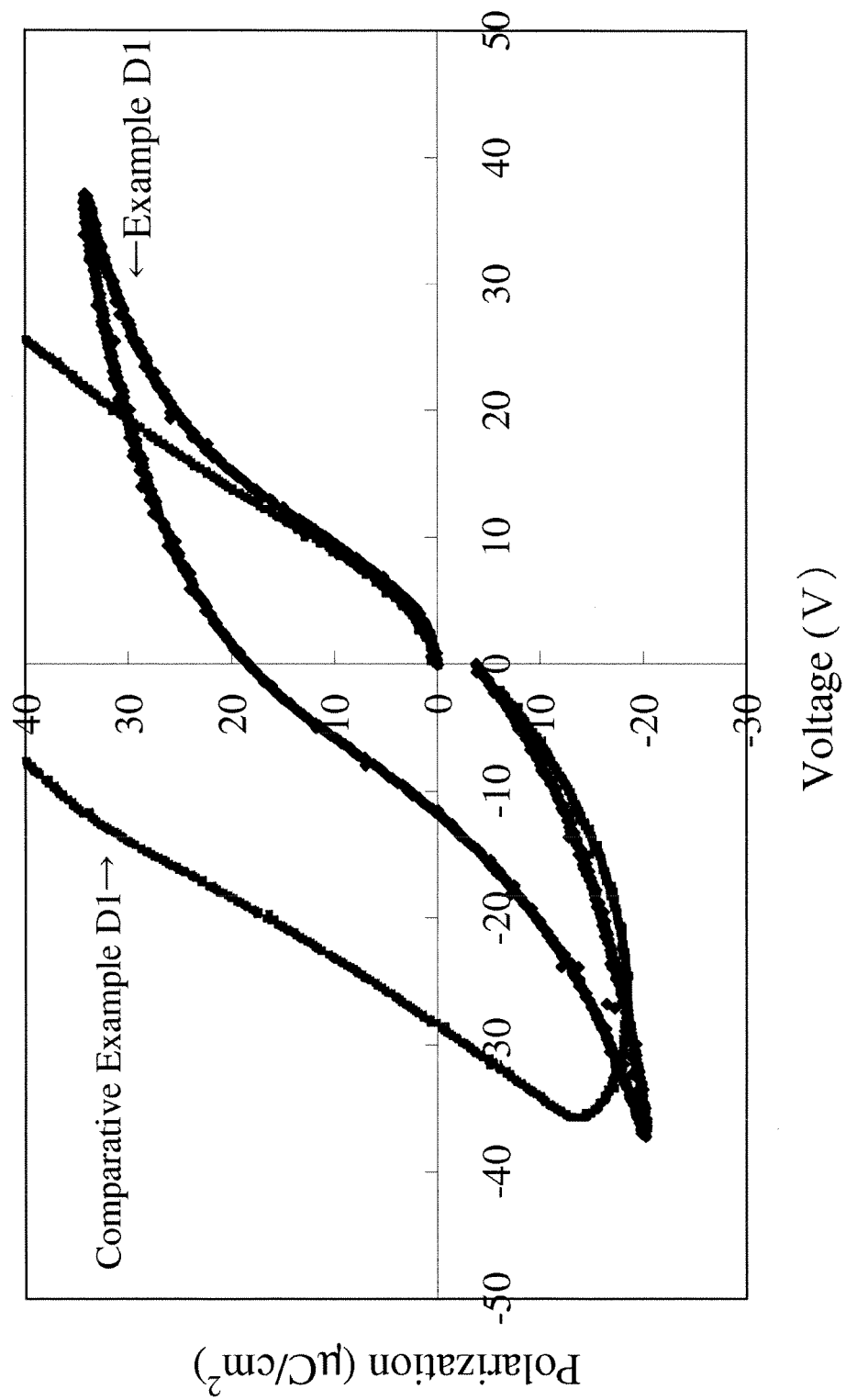
FIG. 24 shows P-E hysteresis curves of the piezoelectric films according to the example D1 and the comparative example D1.

FIG. 11 shows an example of the piezoelectric generating element of the present invention. FIG. 12 shows a cross section F1 of a piezoelectric generating element 22a shown in FIG. 11. The piezoelectric generating elements 22a are elements that convert externally-applied mechanical vibration into electrical energy. The piezoelectric generating elements 22a are applied suitably to a self-sustained power supply for generating electric power from various vibrations including engine vibrations and driving vibrations generated in vehicles and machines, and vibrations generated during walking.

The piezoelectric generating element 22a shown in FIG. 11 comprises a substrate 300 having a vibration part 300b and a piezoelectric film 308 bonded to the vibration part 300b.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric film described in the item titled as "Piezoelectric film". As shown in FIG. 11 and FIG. 12, the piezoelectric film 308 comprises the first electrode 13 (302), the piezoelectric layer 15, and the second electrode 17 (305).

In the piezoelectric generating element shown in FIG. 11, a part of the first electrode 302 is exposed. This part can serve as a connection terminal 302a.

In the piezoelectric generating element shown in FIG. 11, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

[Method of Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

INDUSTRIAL APPLICABILITY

A piezoelectric film comprising the $(1-\alpha)$ (Bi, Na, Ba) $TiO_3$-$\alpha BiQO_3$ layer 15 can be used for an ink jet head, an angular velocity sensor and a piezoelectric generating element.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

REFERENCE SIGNS LIST

11: substrate
13: $Na_xM_{1-x}$ layer (first electrode)
15: $(1-\alpha)$ (Bi, Na, Ba) $TiO_3$-$\alpha BiQO_3$ layer
17: conductive layer (second electrode)

The invention claimed is:

1. A piezoelectric film comprising:
   a $Na_xM_{1-x}$ layer having a (001) orientation only; and
   a $(1-\alpha)$ (Bi, Na, Ba) $TiO_3$-$\alpha BiQO_3$ layer having a (001) orientation only; wherein
   the $(1-\alpha)$ (Bi, Na, Ba) $TiO_3$-$\alpha BiQO_3$ layer is formed on the $Na_xM_{1-x}$ layer;
   M represents Pt, Ir, or PtIr;
   Q represents Fe, Co, $Zn_{0.5}Ti_{0.5}$, or $Mg_{0.5}Ti_{0.5}$;
   x represents a value of not less than 0.002 and not more than 0.02; and
   $\alpha$ represents a value of not less than 0.20 and not more than 0.50.

2. The piezoelectric film according to claim 1, wherein the $(1-\alpha)$ (Bi, Na, Ba) $TiO_3$-$\alpha BiQO_3$ layer is in contact with the $Na_xM_{1-x}$ layer.

3. The piezoelectric film according to claim 1, wherein the $(1-\alpha)$ (Bi, Na, Ba) $TiO_3$-$\alpha BiQO_3$ layer further contains Mn.

* * * * *